(12) United States Patent
Bunea

(10) Patent No.: US 12,034,089 B2
(45) Date of Patent: Jul. 9, 2024

(54) ANTI-REFLECTIVE PHOTOVOLTAIC SHINGLES AND RELATED METHODS

(71) Applicant: GAF Energy LLC, Parsippany, NJ (US)

(72) Inventor: Gabriela Bunea, San Jose, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 18/455,220

(22) Filed: Aug. 24, 2023

(65) Prior Publication Data

US 2024/0079507 A1    Mar. 7, 2024

Related U.S. Application Data

(60) Provisional application No. 63/403,245, filed on Sep. 1, 2022.

(51) Int. Cl.
| | |
|---|---|
| *H02S 20/25* | (2014.01) |
| *E04D 1/30* | (2006.01) |
| *H01L 31/0216* | (2014.01) |
| *H01L 31/048* | (2014.01) |
| *H01L 31/18* | (2006.01) |

(52) U.S. Cl.
CPC .......... *H01L 31/02168* (2013.01); *E04D 1/30* (2013.01); *H01L 31/0488* (2013.01); *H01L 31/18* (2013.01); *H02S 20/25* (2014.12); *E04D 2001/308* (2013.01)

(58) Field of Classification Search
CPC .......... H01L 31/02168; H01L 31/0488; H01L 31/18; E04D 1/30; E04D 2001/308; H02S 20/25
See application file for complete search history.

(56) References Cited

U.S. PATENT DOCUMENTS

| | | |
|---|---|---|
| 1,981,467 A | 11/1934 | Radtke |
| 3,156,497 A | 11/1964 | Lessard |
| 4,258,948 A | 3/1981 | Hoffmann |

(Continued)

FOREIGN PATENT DOCUMENTS

| | | |
|---|---|---|
| CA | 2829440 A | 5/2019 |
| CH | 700095 A2 | 6/2010 |

(Continued)

OTHER PUBLICATIONS

Sunflare, Products: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Phi D A
(74) *Attorney, Agent, or Firm* — GREENBERG TRAURIG, LLP

(57) ABSTRACT

Some embodiments relate to photovoltaic shingle. A photovoltaic shingle comprises an encapsulated solar cell, a glass layer above the encapsulated solar cell, an anti-reflective layer above the glass layer, and a plurality of protrusions above the glass layer. The plurality of protrusions covers at least a portion of at least one of the glass layer, the anti-reflective layer, or any combination thereof, such that the anti-reflective coating is exposed between at least a portion of the plurality of protrusions.

20 Claims, 2 Drawing Sheets

(56) References Cited

U.S. PATENT DOCUMENTS

| | | |
|---|---|---|
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,201,180 B1 | 3/2001 | Meyer et al. |
| 6,220,329 B1 | 4/2001 | King et al. |
| 6,320,114 B1 | 11/2001 | Kuechler |
| 6,320,115 B1 | 11/2001 | Kataoka et al. |
| 6,331,673 B1 | 12/2001 | Kataoya et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eifert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 * | 12/2012 | Shiao .................. H01L 31/048 52/173.3 |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,776,455 B2 | 7/2014 | Azoulay |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 * | 3/2015 | Jenkins .................. H02S 20/23 52/553 |
| 8,994,224 B2 | 3/2015 | Mehta et al. |
| 9,032,672 B2 | 5/2015 | Livsey et al. |
| 9,153,950 B2 | 10/2015 | Yamanaka et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B2 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko |
| 11,251,744 B1 | 2/2022 | Bunea |
| 11,258,399 B2 | 2/2022 | Kalkanoglu et al. |
| 11,283,394 B2 | 3/2022 | Perkins et al. |
| 11,309,828 B2 | 4/2022 | Sirski et al. |
| 11,394,344 B2 | 7/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 11,444,569 B2 | 9/2022 | Clemente et al. |
| 11,454,027 B2 | 9/2022 | Kuiper et al. |
| 11,459,757 B2 | 10/2022 | Nguyen et al. |
| 11,486,144 B2 | 11/2022 | Bunea et al. |
| 11,489,482 B2 | 11/2022 | Peterson et al. |
| 11,496,088 B2 | 11/2022 | Sirski et al. |
| 11,508,861 B1 | 11/2022 | Perkins et al. |
| 11,512,480 B1 | 11/2022 | Achor et al. |
| 11,527,665 B2 | 12/2022 | Boitnott |
| 11,545,927 B2 | 1/2023 | Abra et al. |
| 11,545,928 B2 | 1/2023 | Perkins et al. |
| 11,658,470 B2 | 5/2023 | Nguyen et al. |
| 11,661,745 B2 | 5/2023 | Bunea et al. |
| 11,689,149 B2 | 6/2023 | Clemente et al. |
| 11,705,531 B2 | 7/2023 | Sharenko et al. |
| 11,728,759 B2 | 8/2023 | Nguyen et al. |
| 11,732,490 B2 | 8/2023 | Achor et al. |
| 11,811,361 B1 | 11/2023 | Farhangi et al. |
| 11,824,486 B2 | 11/2023 | Nguyen et al. |
| 11,824,487 B2 | 11/2023 | Nguyen et al. |
| 11,843,067 B2 | 12/2023 | Nguyen et al. |
| 2002/0053360 A1 | 5/2002 | Kinoshita et al. |

(56) References Cited

U.S. PATENT DOCUMENTS

| | | |
|---|---|---|
| 2002/0129849 A1 | 9/2002 | Heckeroth |
| 2003/0101662 A1 | 6/2003 | Ullman |
| 2003/0132265 A1 | 7/2003 | Villela et al. |
| 2003/0217768 A1 | 11/2003 | Guha |
| 2004/0000334 A1 | 1/2004 | Ressler |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2006/0042683 A1 | 3/2006 | Gangemi |
| 2006/0046084 A1 | 3/2006 | Yang et al. |
| 2007/0012353 A1 | 1/2007 | Fischer et al. |
| 2007/0074757 A1 | 4/2007 | Mellott et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1* | 1/2008 | Kalkanoglu ............ H02S 40/20 156/325 |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Fath |
| 2009/0000222 A1 | 1/2009 | Kalkanoglu et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2009/0275247 A1 | 11/2009 | Richter et al. |
| 2010/0019578 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0186798 A1 | 7/2010 | Tormen et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2012/0034799 A1 | 2/2012 | Hunt |
| 2012/0060434 A1* | 3/2012 | Jacobs ................ H01L 31/0392 52/173.3 |
| 2012/0060902 A1 | 3/2012 | Drake |
| 2012/0085392 A1 | 4/2012 | Albert et al. |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pisikak et al. |
| 2012/0282437 A1 | 11/2012 | Clark et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0118558 A1 | 5/2013 | Sherman |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0034111 A1 | 2/2014 | Bunea et al. |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0338272 A1 | 11/2014 | Shiao et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0277691 A1* | 9/2018 | Kärkkäinen ........... H10K 30/82 |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0115223 A1 | 4/2021 | Bonekamp et al. |
| 2021/0159353 A1 | 5/2021 | Li et al. |
| 2021/0343886 A1 | 11/2021 | Sharenko et al. |
| 2022/0149213 A1 | 5/2022 | Mensink et al. |

FOREIGN PATENT DOCUMENTS

| | | |
|---|---|---|
| CN | 202797032 U | 3/2013 |
| DE | 1958248 A1 | 11/1971 |
| EP | 1039361 A1 | 9/2000 |
| EP | 1837162 A1 | 9/2007 |
| EP | 1774372 A1 | 7/2011 |
| EP | 2446481 A2 | 5/2012 |
| EP | 2784241 A1 | 10/2014 |
| JP | 10046767 A | 2/1998 |
| JP | 2002-106151 A | 4/2002 |
| JP | 2001-098703 A | 10/2002 |
| JP | 2017-027735 A | 2/2017 |
| JP | 2018053707 A | 4/2018 |
| KR | 20090084060 A | 8/2009 |
| KR | 10-2019-0000367 A | 1/2019 |
| KR | 10-2253483 B1 | 5/2021 |
| NL | 2026856 B1 | 6/2022 |
| WO | 2011/049944 A1 | 4/2011 |
| WO | 2015/133632 A1 | 9/2015 |
| WO | 2018/000589 A1 | 1/2018 |

(56) References Cited

FOREIGN PATENT DOCUMENTS

| WO | 2019/201416 A1 | 10/2019 |
| WO | 2020-159358 A1 | 8/2020 |
| WO | 2021-247098 A1 | 12/2021 |

OTHER PUBLICATIONS

RGS Energy, 3.5KW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

ANTI-REFLECTIVE PHOTOVOLTAIC SHINGLES AND RELATED METHODS

CROSS-REFERENCE TO RELATED APPLICATIONS

This application claims priority to and benefit of U.S. Provisional Patent Application No. 63/403,245, filed Sep. 1, 2022 and entitled "ANTI-REFLECTIVE PHOTOVOLTAIC ROOFING SHINGLES AND RELATED METHODS," the entirety of which is herein incorporated by reference.

FIELD

This disclosure generally relates to photovoltaic shingles and related methods.

BACKGROUND

Photovoltaic modules are installed on roofing structures. Reflection reduces the performance of photovoltaic modules.

SUMMARY

Some embodiments relate to a roofing system. In some embodiments, the roofing system comprises a roof deck. In some embodiments, the roofing system comprises a plurality of photovoltaic shingles installed on the roof deck. In some embodiments, each of the plurality of photovoltaic shingles comprises an encapsulated solar cell. In some embodiments, each of the plurality of photovoltaic shingles comprises a glass layer located above the encapsulated solar cell. In some embodiments, each of the plurality of photovoltaic shingles comprises an anti-reflective coating located above the glass layer. In some embodiments, each of the plurality of photovoltaic shingles comprises a plurality of protrusions located above the glass layer. In some embodiments, the anti-reflective coating is exposed between at least a portion of the plurality of protrusions.

In some embodiments, the anti-reflective coating covers an entire surface of the glass layer.

In some embodiments, the anti-reflective coating having a thickness of 5 nm to 200 nm.

In some embodiments, the anti-reflective coating comprises at least one a metal oxide, a metal nitride, a metal fluoride, a polymer, or any combination thereof.

In some embodiments, the anti-reflective coating is attached to the glass layer by a first adhesive layer.

In some embodiments, the first adhesive layer comprises at least one of thermosetting polyolefin, thermosetting polyolefin encapsulant material, thermosetting ethylene-vinyl acetate (EVA), EVA encapsulants, thermoplastic olefin, thermoplastic polyolefin (TPO), any hybrids thereof, or any combinations thereof.

In some embodiments, the plurality of protrusions extends above the anti-reflective coating.

In some embodiments, the plurality of protrusions is attached to the glass layer by a second adhesive layer.

In some embodiments, the second adhesive layer comprises at least one of polyvinyl butyrate, acrylic, silicone, polycarbonate, thermosetting polyolefin, thermosetting polyolefin encapsulant material, thermosetting ethylene-vinyl acetate (EVA), EVA encapsulants, thermoplastic olefin, thermoplastic polyolefin (TPO), any hybrid thereof, or any combination thereof.

In some embodiments, the plurality of protrusions covers 10% to 90% of the glass layer.

In some embodiments, the plurality of protrusions is attached to the anti-reflective coating.

In some embodiments, the plurality of protrusions covers 10% to 90% of the anti-reflective coating.

In some embodiments, the plurality of protrusions comprises at least one of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), polyvinyl fluoride (PVF), polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), polyimide, or any combination thereof.

In some embodiments, the plurality of protrusions has a thickness of 0.1 mm to 0.5 mm.

Some embodiments relate to a photovoltaic shingle. In some embodiments, the photovoltaic shingle comprises an encapsulated solar cell. In some embodiments, the photovoltaic shingle comprises a glass layer above the encapsulated solar cell. In some embodiments, the photovoltaic shingle comprises an anti-reflective coating above the glass layer. In some embodiments, the photovoltaic shingle comprises a plurality of protrusions above the glass layer. In some embodiments, the anti-reflective coating is exposed between at least a portion of the plurality of protrusions.

In some embodiments, the anti-reflective coating covers an entire surface of the glass layer.

In some embodiments, the anti-reflective coating having a thickness of 5 nm to 200 nm.

In some embodiments, the anti-reflective coating comprises at least one a metal oxide, a metal nitride, a metal fluoride, a polymer, or any combination thereof.

In some embodiments, the anti-reflective coating is attached to the glass layer by a first adhesive layer.

In some embodiments, the first adhesive layer comprises at least one of thermosetting polyolefin, thermosetting polyolefin encapsulant material, thermosetting ethylene-vinyl acetate (EVA), EVA encapsulants, thermoplastic olefin, thermoplastic polyolefin (TPO), any hybrids thereof, or any combinations thereof.

In some embodiments, the plurality of protrusions extends above the anti-reflective coating.

In some embodiments, the plurality of protrusions is attached to the glass layer by a second adhesive layer.

In some embodiments, the second adhesive layer comprises at least one of polyvinyl butyrate, acrylic, silicone, polycarbonate, thermosetting polyolefin, thermosetting polyolefin encapsulant material, thermosetting ethylene-vinyl acetate (EVA), EVA encapsulants, thermoplastic olefin, thermoplastic polyolefin (TPO), any hybrid thereof, or any combination thereof.

In some embodiments, the plurality of protrusions covers 10% to 90% of the glass layer.

In some embodiments, the plurality of protrusions is attached to the anti-reflective coating.

In some embodiments, the plurality of protrusions covers 10% to 90% of the anti-reflective coating.

In some embodiments, the plurality of protrusions comprises at least one of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), polyvinyl fluoride (PVF), polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), polyimide, or any combination thereof.

In some embodiments, the plurality of protrusions has a thickness of 0.1 mm to 0.5 mm.

Some embodiments relate to a method of manufacturing. In some embodiments, the method of manufacturing comprises obtaining an encapsulated solar cell. In some embodiments, the method of manufacturing comprises obtaining a glass layer. In some embodiments, the method of manufacturing comprises obtaining an anti-reflective precursor material. In some embodiments, the method of manufacturing comprises obtaining a polymeric material. In some embodiments, the method of manufacturing comprises attaching the glass layer to the encapsulated solar cell. In some embodiments, the method of manufacturing comprises applying the anti-reflective precursor material to the glass layer, so as to form an anti-reflective coating. In some embodiments, the method of manufacturing comprises applying the polymeric material to the glass layer or the anti-reflective coating, so as to form a polymer layer. In some embodiments, the method of manufacturing comprises forming a plurality of protrusions in the polymer layer, so as to form a photovoltaic shingle. In some embodiments, the photovoltaic shingle having a first end, a second end opposite the first end, a first edge extending from the first end to the second end, and a second edge opposite the first edge and extending from the first end to the second end.

In some embodiments, the polymeric material is applied to a portion of a surface of the glass layer or the anti-reflective coating.

In some embodiments, the polymeric material is applied in a plurality of strips from the first end of the photovoltaic shingle to the second end of the photovoltaic shingle.

In some embodiments, the polymeric material is applied to an entire surface of the glass layer or the anti-reflective coating.

In some embodiments, the plurality of protrusions is formed by removing a portion of the polymeric material, the polymer layer, or any combination thereof.

In some embodiments, the plurality of protrusions is formed by etching a portion of the polymeric material, the polymer layer, or any combination thereof.

In some embodiments, the plurality of protrusions is formed by scraping a portion of the polymeric material, the polymer layer, or any combination thereof.

In some embodiments, the plurality of protrusions is formed by ablating a portion of the polymeric material, the polymer layer, or any combination thereof.

BRIEF DESCRIPTION OF THE DRAWINGS

Reference is made to the drawings that form a part of this disclosure, and which illustrate embodiments in which the materials and methods described herein can be practiced.

DETAILED DESCRIPTION

Some embodiments relate to photovoltaic shingles and related methods. In some embodiments, photovoltaic shingles having at least one of increased flash power, increased energy production, or any combination thereof, are provided. In some embodiments, the photovoltaic shingles disclosed herein overcome challenges relating to the presence of a polymeric layer in a photovoltaic shingle and corresponding increased reflection at an air-polymer interface, which can reduce flash power and which can reduce energy production, among other things. In some embodiments, a roofing system comprises one or more photovoltaic shingles installed on a roof deck.

Figure 1:
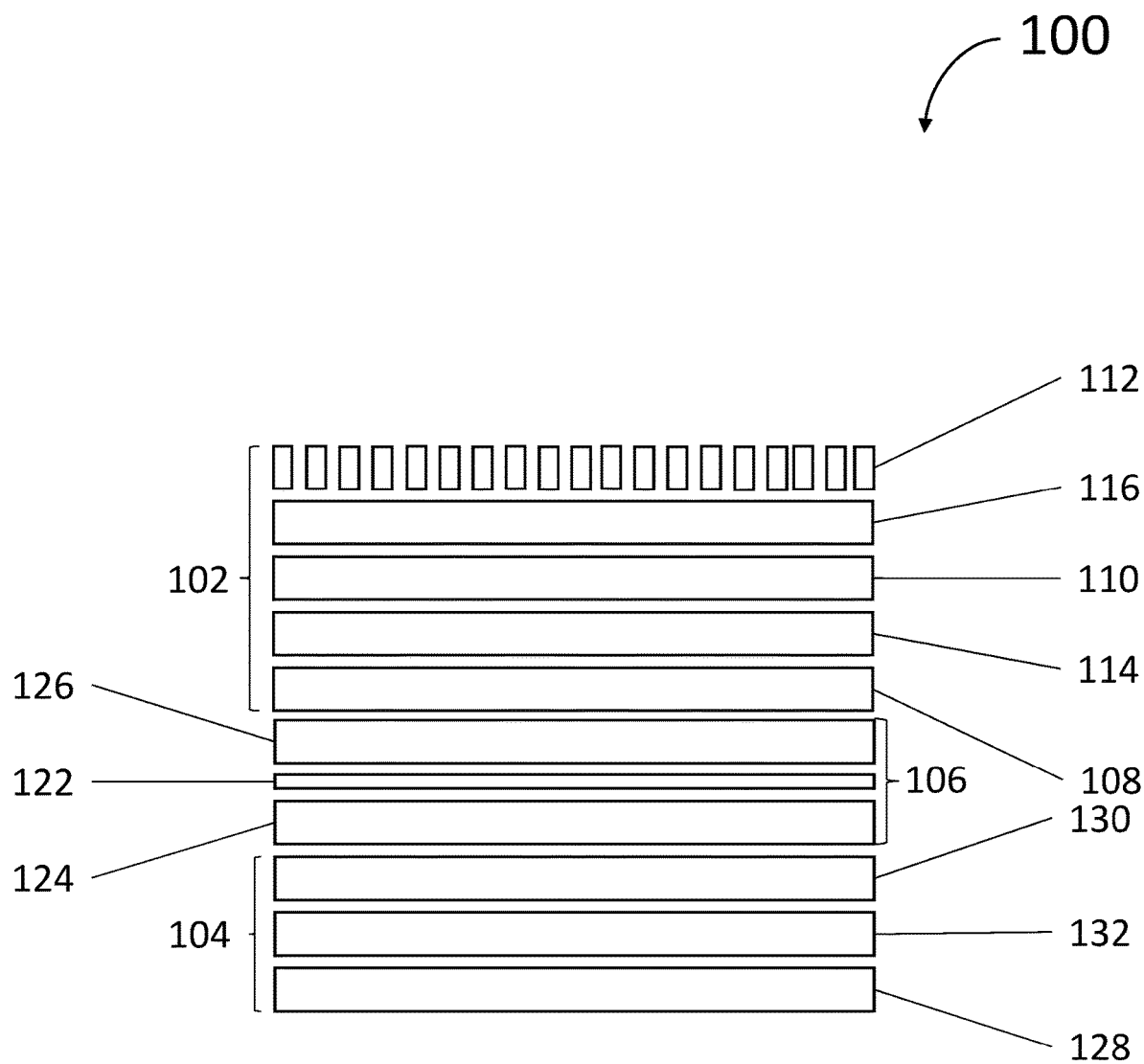
FIG. 1 is a schematic diagram of a cross-section of a photovoltaic shingle, according to some embodiments.

FIG. 1 is a schematic diagram of a cross-section of a photovoltaic shingle 100, according to some embodiments. In some embodiments, the photovoltaic shingle 100 comprises a frontsheet 102, a backsheet 104, and an encapsulated solar cell 106 between the frontsheet 102 and the backsheet 104. In some embodiments, the frontsheet 102 is juxtaposed with a first surface of the encapsulated solar cell 106. In some embodiments, the backsheet 104 is juxtaposed with a second surface of the encapsulated solar cell 106, wherein the second surface of the encapsulated solar cell 106 is opposite the first surface of the encapsulated solar cell 106.

In some embodiments, the frontsheet 102 comprises a glass layer 108 juxtaposed with the first surface of the encapsulated solar cell 106. In some embodiments, the frontsheet 102 comprises an anti-reflective coating 110 located above the glass layer 108. In some embodiments, the anti-reflective coating 110 is adhered to the glass layer 108 by an adhesive layer. In some embodiments, the anti-reflective coating 110 is attached to the glass layer 108 by a first adhesive layer 114. In some embodiments, the anti-reflective coating 110 is attached to the glass layer 108 by thermal bonding. In some embodiments, the anti-reflective coating 110 is attached to the glass layer 108 by chemical bonding. In some embodiments, the frontsheet 102 comprises a plurality of protrusions 112 located above glass layer 108. In some embodiments, the plurality of protrusions 112 is attached to the glass layer 108 by a second adhesive layer 116. In some embodiments, the plurality of protrusions 112 is attached to the anti-reflective coating 110 by the second adhesive layer 116. In some embodiments, the plurality of protrusions 112 is attached to the glass layer 108 or the anti-reflective coating 110 by thermal bonding. In some embodiments, the plurality of protrusions 112 is attached to the glass layer 108 or the anti-reflective coating 110 by chemical bonding. In some embodiments, the frontsheet 102 does not comprise the first adhesive layer 114. In some embodiments, the frontsheet 102 does not comprise the second adhesive layer 116. In some embodiments, the glass layer 108 directly contacts the encapsulated solar cell 106.

In some embodiments, the glass layer 108 has a thickness of 1 mm to 4 mm. In some embodiments, the glass layer 108 has a thickness of 1 mm to 3.5 mm. In some embodiments, the glass layer 108 has a thickness of 1 mm to 3 mm. In some embodiments, the glass layer 108 has a thickness of 1 mm to 2.5 mm. In some embodiments, the glass layer 108 has a thickness of 1 mm to 2 mm. In some embodiments, the glass layer 108 has a thickness of 1 mm to 1.5 mm. In some embodiments, the glass layer 108 has a thickness of 1.5 mm to 4 mm. In some embodiments, the glass layer 108 has a thickness of 1.5 mm to 3.5 mm. In some embodiments, the glass layer 108 has a thickness of 1.5 mm to 3 mm. In some embodiments, the glass layer 108 has a thickness of 1 mm to 2.5 mm. In some embodiments, the glass layer 108 has a thickness of 1.5 mm to 2 mm.

In some embodiments, the glass layer 108 has a thickness of 2 mm to 4 mm. In some embodiments, the glass layer 108 has a thickness of 2 mm to 3.5 mm. In some embodiments, the glass layer 108 has a thickness of 2 mm to 3 mm. In some embodiments, the glass layer 108 has a thickness of 2 mm to 2.5 mm. In some embodiments, the glass layer 108 has a thickness of 2.5 mm to 4 mm. In some embodiments, the glass layer 108 has a thickness of 2.5 mm to 3.5 mm. In some embodiments, the glass layer 108 has a thickness of 2.5 mm to 3 mm. In some embodiments, the glass layer 108 has a thickness of 3 mm to 4 mm. In some embodiments, the glass layer 108 has a thickness of 3 mm to 3.5 mm. In some embodiments, the glass layer 108 has a thickness of 3.5 mm to 4 mm.

In some embodiments, the glass layer 108 has a thickness of 1 mm. In some embodiments, the glass layer 108 has a thickness of 1.5 mm. In some embodiments, the glass layer 108 has a thickness of 2 mm. In some embodiments, the glass layer 108 has a thickness of 2.5 mm. In some embodiments, the glass layer 108 has a thickness of 3 mm. In some embodiments, the glass layer 108 has a thickness of 3.5 mm. In some embodiments, the glass layer 108 has a thickness of 4 mm.

In some embodiments, the anti-reflective coating 110 comprises a coating that minimizes or reduces reflection of light. In some embodiments, the reduction in the reflection of light is in reference to the amount of light that would be reflected in the absence of the anti-reflective coating. In some embodiments, the anti-reflective coating 110 comprises a coating that does not reflect light. In some embodiments, at least some light is reflected when at least a portion of incident radiation is redirected. In some embodiments, the anti-reflective coating 110 comprises a coating that transmits light. In some embodiments, at least some light is transmitted when at least a portion of incident radiation passes through a substance. In some embodiments, the anti-reflective coating 110 comprises a coating that absorbs light. In some embodiments, at least some light is absorbed when at least a portion of incident radiation is transformed from electromagnetic energy to another type of energy (e.g., thermal energy). In some embodiments, the light that is transmitted, absorbed, or any combination thereof is light in at least one of the infrared region of the electromagnetic spectrum (e.g., at least one of the near-infrared region of the electromagnetic spectrum, the far-infrared region of the electromagnetic spectrum, or any combination thereof), the ultraviolet region of the electromagnetic spectrum, the visible region of the electromagnetic spectrum, or any combination thereof. In some embodiments, the anti-reflective coating 110 comprises a coating for maximizing absorption of solar radiation. In some embodiments, a photometer is used to measure at least one of light absorption, light reflection, light transmission, or any combination thereof.

In some embodiments, the anti-reflective coating comprises an anti-reflective component. In some embodiments, the anti-reflective component comprises at least one of a metal oxide, a nitride compound, a metal fluoride, a polymer, or any combination thereof. In some embodiments, the anti-reflective coating 110 comprises a metal oxide. In some embodiments, the anti-reflective coating 110 comprises at least one of tantalum oxide, niobium oxide, vanadium oxide, titanium oxide, zirconium oxide, yttrium oxide, hafnium oxide, cerium oxide, tin oxide, aluminum oxide, or any combination thereof. In some embodiments, the anti-reflective coating 110 comprises silicon oxide. In some embodiments, the anti-reflective coating comprises a metal nitride. In some embodiments, the anti-reflective coating 110 comprises silicon nitride. In some embodiments, the anti-reflective coating 110 comprises carbo-nitrides. In some embodiments, the anti-reflective coating 110 comprises carbo-oxynitrides. In some embodiments, the anti-reflective coating 110 comprises a metal fluoride. In some embodiments, the anti-reflective coating 110 comprises a polymer.

In some embodiments, the anti-reflective coating comprises 1% to 99% by weight of the anti-reflective component based on a total weight of the anti-reflective coating. In some embodiments, the anti-reflective coating comprises 1% to 90% by weight of the anti-reflective component based on the total weight of the anti-reflective coating. In some embodiments, the anti-reflective coating comprises 1% to 80% by weight of the anti-reflective component based on the total weight of the anti-reflective coating. In some embodiments, the anti-reflective coating comprises 1% to 70% by weight of the anti-reflective component based on the total weight of the anti-reflective coating. In some embodiments, the anti-reflective coating comprises 1% to 60% by weight of the anti-reflective component based on the total weight of the anti-reflective coating. In some embodiments, the anti-reflective coating comprises 1% to 50% by weight of the anti-reflective component based on the total weight of the anti-reflective coating. In some embodiments, the anti-reflective coating comprises 1% to 40% by weight of the anti-reflective component based on the total weight of the anti-reflective coating. In some embodiments, the anti-reflective coating comprises 1% to 30% by weight of the anti-reflective component based on the total weight of the anti-reflective coating. In some embodiments, the anti-reflective coating comprises 1% to 20% by weight of the anti-reflective component based on the total weight of the anti-reflective coating. In some embodiments, the anti-reflective coating comprises 1% to 10% by weight of the anti-reflective component based on the total weight of the anti-reflective coating. In some embodiments, the anti-reflective coating comprises 1% to 5% by weight of the anti-reflective component based on the total weight of the anti-reflective coating.

In some embodiments, the anti-reflective coating comprises 10% to 99% by weight of the anti-reflective component based on the total weight of the anti-reflective coating. In some embodiments, the anti-reflective coating comprises 20% to 99% by weight of the anti-reflective component based on the total weight of the anti-reflective coating. In some embodiments, the anti-reflective coating comprises 30% to 99% by weight of the anti-reflective component based on the total weight of the anti-reflective coating. In some embodiments, the anti-reflective coating comprises 40% to 99% by weight of the anti-reflective component based on the total weight of the anti-reflective coating. In some embodiments, the anti-reflective coating comprises 50% to 99% by weight of the anti-reflective component based on the total weight of the anti-reflective coating. In some embodiments, the anti-reflective coating comprises 60% to 99% by weight of the anti-reflective component based on the total weight of the anti-reflective coating. In some embodiments, the anti-reflective coating comprises 70% to 99% by weight of the anti-reflective component based on the total weight of the anti-reflective coating. In some embodiments, the anti-reflective coating comprises 80% to 99% by weight of the anti-reflective component based on the total weight of the anti-reflective coating. In some embodiments, the anti-reflective coating comprises 90% to 99% by weight of the anti-reflective component based on the total weight of the anti-reflective coating.

In some embodiments, the anti-reflective coating 110 has a thickness of 5 nm to 200 nm. In some embodiments, the anti-reflective coating 110 has a thickness of 5 nm to 190 nm. In some embodiments, the anti-reflective coating 110 has a thickness of 5 nm to 180 nm. In some embodiments, the anti-reflective coating 110 has a thickness of 5 nm to 170 nm. In some embodiments, the anti-reflective coating 110 has a thickness of 5 nm to 160 nm. In some embodiments, the anti-reflective coating 110 has a thickness of 5 nm to 150 nm. In some embodiments, the anti-reflective coating 110 has a thickness of 5 nm to 140 nm. In some embodiments, the anti-reflective coating 110 has a thickness of 5 nm to 130 nm. In some embodiments, the anti-reflective coating 110 has a thickness of 5 nm to 120 nm. In some embodiments, the anti-reflective coating 110 has a thickness of 5 nm to 110 nm. In some embodiments, the anti-reflective coating 110 has a thickness of 5 nm to 100 nm.

In some embodiments, the anti-reflective coating 110 has a thickness of 5 nm to 90 nm. In some embodiments, the anti-reflective coating 110 has a thickness of 5 nm to 80 nm. In some embodiments, the anti-reflective coating 110 has a thickness of 5 nm to 70 nm. In some embodiments, the anti-reflective coating 110 has a thickness of 5 nm to 60 nm. In some embodiments, the anti-reflective coating 110 has a thickness of 5 nm to 50 nm. In some embodiments, the anti-reflective coating 110 has a thickness of 5 nm to 40 nm. In some embodiments, the anti-reflective coating 110 has a thickness of 5 nm to 30 nm. In some embodiments, the anti-reflective coating 110 has a thickness of 5 nm to 20 nm. In some embodiments, the anti-reflective coating 110 has a thickness of 5 nm to 10 nm.

In some embodiments, the anti-reflective coating 110 has a thickness of 10 nm to 200 nm. In some embodiments, the anti-reflective coating 110 has a thickness of 20 nm to 200 nm. In some embodiments, the anti-reflective coating 110 has a thickness of 30 nm to 200 nm. In some embodiments, the anti-reflective coating 110 has a thickness of 40 nm to 200 nm. In some embodiments, the anti-reflective coating 110 has a thickness of 50 nm to 200 nm. In some embodiments, the anti-reflective coating 110 has a thickness of 60 nm to 200 nm. In some embodiments, the anti-reflective coating 110 has a thickness of 70 nm to 200 nm. In some embodiments, the anti-reflective coating 110 has a thickness of 80 nm to 200 nm. In some embodiments, the anti-reflective coating 110 has a thickness of 90 nm to 200 nm. In some embodiments, the anti-reflective coating 110 has a thickness of 100 nm to 200 nm.

In some embodiments, the anti-reflective coating 110 has a thickness of 110 nm to 200 nm. In some embodiments, the anti-reflective coating 110 has a thickness of 120 nm to 200 nm. In some embodiments, the anti-reflective coating 110 has a thickness of 130 nm to 200 nm. In some embodiments, the anti-reflective coating 110 has a thickness of 140 nm to 200 nm. In some embodiments, the anti-reflective coating 110 has a thickness of 150 nm to 200 nm. In some embodiments, the anti-reflective coating 110 has a thickness of 160 nm to 200 nm. In some embodiments, the anti-reflective coating 110 has a thickness of 170 nm to 200 nm. In some embodiments, the anti-reflective coating 110 has a thickness of 180 nm to 200 nm. In some embodiments, the anti-reflective coating 110 has a thickness of 190 nm to 200 nm.

As used herein, the term "covers" refers to a percentage of a surface area of a surface which is covered.

In some embodiments, the anti-reflective coating 110 covers at least a portion of a top surface of the glass layer 108. In some embodiments, the anti-reflective coating 110 covers at least 10% of the top surface of the glass layer 108. In some embodiments, the anti-reflective coating 110 covers at least 20% of the top surface of the glass layer 108. In some embodiments, the anti-reflective coating 110 covers at least 30% of the top surface of the glass layer 108. In some embodiments, the anti-reflective coating 110 covers at least 35% of the top surface of the glass layer 108. In some embodiments, the anti-reflective coating 110 covers at least 40% of the top surface of the glass layer 108. In some embodiments, the anti-reflective coating 110 covers at least 45% of the top surface of the glass layer 108.

In some embodiments, the anti-reflective coating 110 covers at least 50% of the top surface of the glass layer 108. In some embodiments, the anti-reflective coating 110 covers at least 55% of the top surface of the glass layer 108. In some embodiments, the anti-reflective coating 110 covers at least 60% of the top surface of the glass layer 108. In some embodiments, the anti-reflective coating 110 covers at least 65% of the top surface of the glass layer 108. In some embodiments, the anti-reflective coating 110 covers at least 70% of the top surface of the glass layer 108. In some embodiments, the anti-reflective coating 110 covers at least 75% of the top surface of the glass layer 108. In some embodiments, the anti-reflective coating 110 covers at least 80% of the top surface of the glass layer 108. In some embodiments, the anti-reflective coating 110 covers at least 85% of the top surface of the glass layer 108. In some embodiments, the anti-reflective coating 110 covers at least 90% of the top surface of the glass layer 108. In some embodiments, the anti-reflective coating 110 covers at least 95% of the top surface of the glass layer 108. In some embodiments, the anti-reflective coating 110 covers an entire surface of the glass layer 108.

In some embodiments, the anti-reflective coating 110 covers 10% to 100% of the top surface of the glass layer 108. In some embodiments, the anti-reflective coating 110 covers 10% to 90% of the top surface of the glass layer 108. In some embodiments, the anti-reflective coating 110 covers 10% to 80% of the top surface of the glass layer 108. In some embodiments, the anti-reflective coating 110 covers 10% to 70% of the top surface of the glass layer 108. In some embodiments, the anti-reflective coating 110 covers 10% to 60% of the top surface of the glass layer 108. In some embodiments, the anti-reflective coating 110 covers 10% to 50% of the top surface of the glass layer 108. In some embodiments, the anti-reflective coating 110 covers 10% to 40% of the top surface of the glass layer 108. In some embodiments, the anti-reflective coating 110 covers 10% to 30% of the top surface of the glass layer 108. In some embodiments, the anti-reflective coating 110 covers 10% to 20% of the top surface of the glass layer 108.

In some embodiments, the anti-reflective coating 110 covers 20% to 100% of the top surface of the glass layer 108. In some embodiments, the anti-reflective coating 110 covers 30% to 100% of the top surface of the glass layer 108. In some embodiments, the anti-reflective coating 110 covers 40% to 100% of the top surface of the glass layer 108. In some embodiments, the anti-reflective coating 110 covers 50% to 100% of the top surface of the glass layer 108. In some embodiments, the anti-reflective coating 110 covers 60% to 100% of the top surface of the glass layer 108. In some embodiments, the anti-reflective coating 110 covers 70% to 100% of the top surface of the glass layer 108. In some embodiments, the anti-reflective coating 110 covers 80% to 100% of the top surface of the glass layer 108. In some embodiments, the anti-reflective coating 110 covers 90% to 100% of the top surface of the glass layer 108.

As used herein, the term "exposed" refers to a percentage of a surface area of a surface which is not covered.

In some embodiments, 10% to 100% of the anti-reflective coating is exposed between at least a portion of the plurality of protrusions 112. In some embodiments, 10% to 90% of the anti-reflective coating is exposed between at least a portion of the plurality of protrusions 112. In some embodiments, 10% to 80% of the anti-reflective coating is exposed between at least a portion of the plurality of protrusions 112. In some embodiments, 10% to 70% of the anti-reflective coating is exposed between at least a portion of the plurality of protrusions 112. In some embodiments, 10% to 60% of the anti-reflective coating is exposed between at least a portion of the plurality of protrusions 112. In some embodiments, 10% to 50% of the anti-reflective coating is exposed between at least a portion of the plurality of protrusions 112. In some embodiments, 10% to 40% of the anti-reflective coating is exposed between at least a portion of the plurality of protrusions 112. In some embodiments, 10% to 30% of the anti-reflective coating is exposed between at least a portion of the plurality of protrusions 112. In some embodiments, 10% to 20% of the anti-reflective coating is exposed between at least a portion of the plurality of protrusions 112. In some embodiments, 1% to 99% of the anti-reflective coating is exposed between the plurality of protrusions 112.

In some embodiments, 20% to 100% of the anti-reflective coating is exposed between at least a portion of the plurality of protrusions 112. In some embodiments, 30% to 100% of the anti-reflective coating is exposed between at least a portion of the plurality of protrusions 112. In some embodiments, 40% to 100% of the anti-reflective coating is exposed between at least a portion of the plurality of protrusions 112. In some embodiments, 50% to 100% of the anti-reflective coating is exposed between at least a portion of the plurality of protrusions 112. In some embodiments, 60% to 100% of the anti-reflective coating is exposed between at least a portion of the plurality of protrusions 112. In some embodiments, 70% to 100% of the anti-reflective coating is exposed between at least a portion of the plurality of protrusions 112. In some embodiments, 80% to 100% of the anti-reflective coating is exposed between at least a portion of the plurality of protrusions 112. In some embodiments, 90% to 100% of the anti-reflective coating is exposed between at least a portion of the plurality of protrusions 112.

In some embodiments, the plurality of protrusions 112 extend from the glass layer 108. In some embodiments, the plurality of protrusions 112 extend from a top surface of the glass layer 108. In some embodiments, the plurality of protrusions 112 extend from the anti-reflective coating 110. In some embodiments, the plurality of protrusions 112 extend from a top surface of the anti-reflective coating 110. In some embodiments, the plurality of protrusions 112 extend above the top surface of the glass layer 108. In some embodiments, the plurality of protrusions 112 extend above the top surface of the anti-reflective coating 110. In some embodiments, the plurality of protrusions 112 extends across the top surface of the glass layer 108, from a first end of the glass layer 108 to a second end of the glass layer 108. In some embodiments, the plurality of protrusions 112 extends across the top surface of the glass layer 108, from a first end of the glass layer 108 to a second end of the glass layer 108. In some embodiments, the plurality of protrusions 112 is adhered to the anti-reflective coating 110 by an adhesive. In some embodiments, the plurality of protrusions 112 directly contacts the anti-reflective coating 110.

In some embodiments, the plurality of protrusions 112 has a height of 0.01 mm to 0.5 mm. As used herein, the term "height" refers to a dimension of the plurality of protrusions measured from a first end to a second end. In some embodiments, the plurality of protrusions 112 has a height of 0.01 mm to 0.5 mm. In some embodiments, the plurality of protrusions 112 has a height of 0.01 mm to 0.45 mm. In some embodiments, the plurality of protrusions 112 has a height of 0.01 mm to 0.4 mm. In some embodiments, the plurality of protrusions 112 has a height of 0.01 mm to 0.35 mm. In some embodiments, the plurality of protrusions 112 has a height of 0.01 mm to 0.3 mm. In some embodiments, the plurality of protrusions 112 has a height of 0.01 mm to 0.25 mm. In some embodiments, the plurality of protrusions 112 has a height of 0.01 mm to 0.2 mm. In some embodiments, the plurality of protrusions 112 has a height of 0.01 mm to 0.15 mm. In some embodiments, the plurality of protrusions 112 has a height of 0.01 mm to 0.1 mm. In some embodiments, the plurality of protrusions 112 has a height of 0.01 mm to 0.05 mm.

In some embodiments, the plurality of protrusions 112 has a height of 0.05 mm to 0.5 mm. In some embodiments, the plurality of protrusions 112 has a height of 0.05 mm to 0.45 mm. In some embodiments, the plurality of protrusions 112 has a height of 0.05 mm to 0.4 mm. In some embodiments, the plurality of protrusions 112 has a height of 0.05 mm to 0.35 mm. In some embodiments, the plurality of protrusions 112 has a height of 0.05 mm to 0.3 mm. In some embodiments, the plurality of protrusions 112 has a height of 0.05 mm to 0.25 mm. In some embodiments, the plurality of protrusions 112 has a height of 0.05 mm to 0.2 mm. In some embodiments, the plurality of protrusions 112 has a height of 0.05 mm to 0.15 mm. In some embodiments, the plurality of protrusions 112 has a height of 0.05 mm to 0.1 mm.

In some embodiments, the plurality of protrusions 112 has a height of 0.1 mm to 0.5 mm. In some embodiments, the plurality of protrusions 112 has a height of 0.1 mm to 0.45 mm. In some embodiments, the plurality of protrusions 112 has a height of 0.1 mm to 0.4 mm. In some embodiments, the plurality of protrusions 112 has a height of 0.1 mm to 0.35 mm. In some embodiments, the plurality of protrusions 112 has a height of 0.1 mm to 0.3 mm. In some embodiments, the plurality of protrusions 112 has a height of 0.1 mm to 0.25 mm. In some embodiments, the plurality of protrusions 112 has a height of 0.1 mm to 0.2 mm. In some embodiments, the plurality of protrusions 112 has a height of 0.1 mm to 0.15 mm. In some embodiments, the plurality of protrusions 112 has a height of 0.15 mm to 0.5 mm. In some embodiments, the plurality of protrusions 112 has a height of 0.15 mm to 0.45 mm. In some embodiments, the plurality of protrusions 112 has a height of 0.15 mm to 0.4 mm. In some embodiments, the plurality of protrusions 112 has a height of 0.15 mm to 0.35 mm. In some embodiments, the plurality of protrusions 112 has a height of 0.15 mm to 0.3 mm. In some embodiments, the plurality of protrusions 112 has a height of 0.15 mm to 0.25 mm. In some embodiments, the plurality of protrusions 112 has a height of 0.15 mm to 0.2 mm.

In some embodiments, the plurality of protrusions 112 has a height of 0.2 mm to 0.5 mm. In some embodiments, the plurality of protrusions 112 has a height of 0.2 mm to 0.45 mm. In some embodiments, the plurality of protrusions 112 has a height of 0.2 mm to 0.4 mm. In some embodiments, the plurality of protrusions 112 has a height of 0.2 mm to 0.35 mm. In some embodiments, the plurality of protrusions 112 has a height of 0.2 mm to 0.3 mm. In some embodiments, the plurality of protrusions 112 has a height of 0.2 mm to 0.25 mm. In some embodiments, the plurality of protrusions 112 has a height of 0.25 mm to 0.5 mm. In some embodiments, the plurality of protrusions 112 has a height of 0.25 mm to 0.45 mm. In some embodiments, the plurality of protrusions 112 has a height of 0.25 mm to 0.4 mm. In some embodiments, the plurality of protrusions 112 has a height of 0.25 mm to 0.35 mm. In some embodiments, the plurality of protrusions 112 has a height of 0.25 mm to 0.3 mm.

In some embodiments, the plurality of protrusions 112 has a height of 0.3 mm to 0.5 mm. In some embodiments, the plurality of protrusions 112 has a height of 0.3 mm to 0.45 mm. In some embodiments, the plurality of protrusions 112 has a height of 0.3 mm to 0.4 mm. In some embodiments, the plurality of protrusions 112 has a height of 0.3 mm to 0.35 mm. In some embodiments, the plurality of protrusions 112 has a height of 0.35 mm to 0.5 mm. In some embodiments, the plurality of protrusions 112 has a height of 0.35 mm to 0.45 mm. In some embodiments, the plurality of protrusions 112 has a height of 0.35 mm to 0.4 mm. In some embodiments, the plurality of protrusions 112 has a height of 0.4 mm to 0.5 mm. In some embodiments, the plurality of protrusions 112 has a height of 0.4 mm to 0.45 mm. In some embodiments, the plurality of protrusions 112 has a height of 0.45 mm to 0.5 mm.

In some embodiments, the plurality of protrusions 112 has a height of 0.01 mm. In some embodiments, the plurality of protrusions 112 has a height of 0.05 mm. In some embodiments, the plurality of protrusions 112 has a height of 0.1 mm. In some embodiments, the plurality of protrusions 112 has a height of 0.15 mm. In some embodiments, the plurality of protrusions 112 has a height of 0.2 mm. In some embodiments, the plurality of protrusions 112 has a height of 0.25 mm. In some embodiments, the plurality of protrusions 112 has a height of 0.3 mm. In some embodiments, the plurality of protrusions 112 has a height of 0.35 mm. In some embodiments, the plurality of protrusions 112 has a height of 0.4 mm. In some embodiments, the plurality of protrusions 112 has a height of 0.45 mm. In some embodiments, the plurality of protrusions 112 has a height of 0.5 mm.

In some embodiments, the plurality of protrusions 112 covers 10% to 90% of the glass layer 108. In some embodiments, the plurality of protrusions 112 covers 10% to 85% of the glass layer 108. In some embodiments, the plurality of protrusions 112 covers 10% to 80% of the glass layer 108. In some embodiments, the plurality of protrusions 112 covers 10% to 75% of the glass layer 108. In some embodiments, the plurality of protrusions 112 covers 10% to 70% of the glass layer 108. In some embodiments, the plurality of protrusions 112 covers 10% to 65% of the glass layer 108. In some embodiments, the plurality of protrusions 112 covers 10% to 60% of the glass layer 108. In some embodiments, the plurality of protrusions 112 covers 10% to 55% of the glass layer 108.

In some embodiments, the plurality of protrusions 112 covers 10% to 50% of the glass layer 108. In some embodiments, the plurality of protrusions 112 covers 10% to 45% of the glass layer 108. In some embodiments, the plurality of protrusions 112 covers 10% to 40% of the glass layer 108. In some embodiments, the plurality of protrusions 112 covers 10% to 35% of the glass layer 108. In some embodiments, the plurality of protrusions 112 covers 10% to 30% of the glass layer 108. In some embodiments, the plurality of protrusions 112 covers 10% to 25% of the glass layer 108. In some embodiments, the plurality of protrusions 112 covers 10% to 20% of the glass layer 108. In some embodiments, the plurality of protrusions 112 covers 10% to 15% of the glass layer 108.

In some embodiments, the plurality of protrusions 112 covers 1% to 99% of the anti-reflective coating 110. In some embodiments, the plurality of protrusions 112 covers 10% to 90% of the anti-reflective coating 110. In some embodiments, the plurality of protrusions 112 covers 15% to 90% of the anti-reflective coating 110. In some embodiments, the plurality of protrusions 112 covers 20% to 90% of the anti-reflective coating 110. In some embodiments, the plurality of protrusions 112 covers 25% to 90% of the anti-reflective coating 110. In some embodiments, the plurality of protrusions 112 covers 30% to 90% of the anti-reflective coating 110. In some embodiments, the plurality of protrusions 112 covers 35% to 90% of the anti-reflective coating 110. In some embodiments, the plurality of protrusions 112 covers 40% to 90% of the anti-reflective coating 110. In some embodiments, the plurality of protrusions 112 covers 45% to 90% of the anti-reflective coating 110. In some embodiments, the plurality of protrusions 112 covers 50% to 90% of the anti-reflective coating 110.

In some embodiments, the plurality of protrusions 112 covers 55% to 90% of the anti-reflective coating 110. In some embodiments, the plurality of protrusions 112 covers 60% to 90% of the anti-reflective coating 110. In some embodiments, the plurality of protrusions 112 covers 65% to 90% of the anti-reflective coating 110. In some embodiments, the plurality of protrusions 112 covers 70% to 90% of the anti-reflective coating 110. In some embodiments, the plurality of protrusions 112 covers 75% to 90% of the anti-reflective coating 110. In some embodiments, the plurality of protrusions 112 covers 80% to 90% of the anti-reflective coating 110. In some embodiments, the plurality of protrusions 112 covers 85% to 90% of the anti-reflective coating 110.

In some embodiments, the plurality of protrusions 112 comprises a plurality of pillars. In some embodiments, the plurality of protrusions 112 comprises a plurality of square pillars. In some embodiments, the plurality of protrusions 112 comprises a plurality of non-rectangular quadrilateral pillars (e.g., lozenges). In some embodiments, the plurality of protrusions 112 comprises a plurality of circular pillars. In some embodiments, the plurality of protrusions 112 comprises a plurality of hexagonal pillars. In some embodiments, the plurality of protrusions 112 comprises a plurality of rectangular pillars. In some embodiments, the plurality of protrusions 112 comprises a plurality of polygonal pillars, wherein the polygonal pillars include at least one of triangular pillars, quadrilateral pillars, pentagonal pillars, rectangular pillars, hexagonal pillars, etc., or any combination thereof. In some embodiments, the plurality of protrusions 112 comprises a plurality of stripes. It will be appreciated that the plurality of protrusions 112 may have other geometric or non-geometric shapes. In some embodiments, the plurality of protrusions 112 may be arranged in a uniform pattern (e.g., periodic ordered array), a non-uniform pattern (e.g., a random pattern), or any combination thereof. In some embodiments, the plurality of protrusions 112 have a size gradient (e.g., including similarly shaped elements of different sizes, such as different sized triangles, etc.). In some embodiments, the plurality of protrusions 112 is a textured surface. In some embodiments, the plurality of protrusions 112 comprises textured ETFE.

In some embodiments, the plurality of protrusions 112 comprises a fluoropolymer. In some embodiments, the plurality of protrusions 112 comprises ethylene tetrafluoroethylene (ETFE). In some embodiments, the plurality of protrusions 112 comprises polyvinylidene fluoride (PVDF). In some embodiments, the plurality of protrusions 112 comprises tetrafluoroethylene-hexafluoropropylene copolymers (FEP). In some embodiments, the plurality of protrusions 112 comprises tetrafluoroethylene-hexafluoropropylene-vinylidene fluoride copolymers (THV). In some embodiments, the plurality of protrusions 112 comprises polyvinyl fluoride (PVF). In some embodiments, the plurality of protrusions 112 comprises blends of fluoropolymers. In some embodiments, the plurality of protrusions 112 comprises at least one of fluoropolymers, acrylics, polyesters, silicones, polycarbonates, or any combination thereof. In some embodiments, the plurality of protrusions comprises at least one of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), polyimide, or any combination thereof. In some embodiments, the plurality of protrusions 112 comprises a crosslinked polymeric material. In some embodiments, 50% to 99% of the polymer chains of the polymeric material are crosslinked.

In some embodiments, the plurality of protrusions 112 comprises from 2 to 10,000 protrusions. In some embodiments, the plurality of protrusions 112 comprises from 2 to 9,000 protrusions. In some embodiments, the plurality of protrusions 112 comprises from 2 to 8,000 protrusions. In some embodiments, the plurality of protrusions 112 comprises from 2 to 7,000 protrusions. In some embodiments, the plurality of protrusions 112 comprises from 2 to 6,000 protrusions. In some embodiments, the plurality of protrusions 112 comprises from 2 to 5,000 protrusions. In some embodiments, the plurality of protrusions 112 comprises from 2 to 4,000 protrusions. In some embodiments, the plurality of protrusions 112 comprises from 2 to 3,000 protrusions. In some embodiments, the plurality of protrusions 112 comprises from 2 to 2,000 protrusions. In some embodiments, the plurality of protrusions 112 comprises from 2 to 1,000 protrusions.

In some embodiments, the plurality of protrusions 112 comprises from 2 to 900 protrusions. In some embodiments, the plurality of protrusions 112 comprises from 2 to 800 protrusions. In some embodiments, the plurality of protrusions 112 comprises from 2 to 700 protrusions. In some embodiments, the plurality of protrusions 112 comprises from 2 to 600 protrusions. In some embodiments, the plurality of protrusions 112 comprises from 2 to 500 protrusions. In some embodiments, the plurality of protrusions 112 comprises from 2 to 400 protrusions. In some embodiments, the plurality of protrusions 112 comprises from 2 to 300 protrusions. In some embodiments, the plurality of protrusions 112 comprises from 2 to 200 protrusions. In some embodiments, the plurality of protrusions 112 comprises from 2 to 100 protrusions.

In some embodiments, the plurality of protrusions 112 comprises from 2 to 90 protrusions. In some embodiments, the plurality of protrusions 112 comprises from 2 to 80 protrusions. In some embodiments, the plurality of protrusions 112 comprises from 2 to 70 protrusions. In some embodiments, the plurality of protrusions 112 comprises from 2 to 60 protrusions. In some embodiments, the plurality of protrusions 112 comprises from 2 to 50 protrusions. In some embodiments, the plurality of protrusions 112 comprises from 2 to 40 protrusions. In some embodiments, the plurality of protrusions 112 comprises from 2 to 30 protrusions. In some embodiments, the plurality of protrusions 112 comprises from 2 to 20 protrusions. In some embodiments, the plurality of protrusions 112 comprises from 2 to 10 protrusions.

In some embodiments, the plurality of protrusions 112 comprises from 100 to 10,000 protrusions. In some embodiments, the plurality of protrusions 112 comprises from 1000 to 10,000 protrusions. In some embodiments, the plurality of protrusions 112 comprises from 2000 to 10,000 protrusions.

In some embodiments, the plurality of protrusions 112 comprises from 3000 to 10,000 protrusions. In some embodiments, the plurality of protrusions 112 comprises from 4000 to 10,000 protrusions. In some embodiments, the plurality of protrusions 112 comprises from 5000 to 10,000 protrusions. In some embodiments, the plurality of protrusions 112 comprises from 6000 to 10,000 protrusions. In some embodiments, the plurality of protrusions 112 comprises from 7000 to 10,000 protrusions. In some embodiments, the plurality of protrusions 112 comprises from 8000 to 10,000 protrusions. In some embodiments, the plurality of protrusions 112 comprises from 9000 to 10,000 protrusions.

In some embodiments, the first adhesive layer 114 comprises at least one of thermosetting polyolefin, thermosetting polyolefin encapsulant material, thermosetting ethylene-vinyl acetate (EVA), EVA encapsulants, thermoplastic olefin, thermoplastic polyolefin (TPO), any hybrids thereof, or any combinations thereof.

In some embodiments, the first adhesive layer 114 has a thickness of 0.2 mm to 2 mm. In some embodiments, the first adhesive layer 114 has a thickness of 0.2 mm to 1.5 mm. In some embodiments, the first adhesive layer 114 has a thickness of 0.2 mm to 1 mm. In some embodiments, the first adhesive layer 114 has a thickness of 0.2 mm to 0.5 mm. In some embodiments, the first adhesive layer 114 has a thickness of 0.5 mm to 2 mm. In some embodiments, the first adhesive layer 114 has a thickness of 0.5 mm to 1.5 mm. In some embodiments, the first adhesive layer 114 has a thickness of 0.5 mm to 1 mm. In some embodiments, the first adhesive layer 114 has a thickness of 1 mm to 2 mm. In some embodiments, the first adhesive layer 114 has a thickness of 1 mm to 1.5 mm. In some embodiments, the first adhesive layer 114 has a thickness of 1.5 mm to 2 mm.

In some embodiments, the first adhesive layer 114 has a thickness of 0.2 mm. In some embodiments, the first adhesive layer 114 has a thickness of 0.3 mm. In some embodiments, the first adhesive layer 114 has a thickness of 0.4 mm. In some embodiments, the first adhesive layer 114 has a thickness of 0.45 mm. In some embodiments, the first adhesive layer 114 has a thickness of 0.5 mm. In some embodiments, the first adhesive layer 114 has a thickness of 1 mm. In some embodiments, the first adhesive layer 114 has a thickness of 1.5 mm. In some embodiments, the first adhesive layer 114 has a thickness of 2 mm. In some embodiments, the first adhesive layer 114 has a thickness of 2.5 mm. In some embodiments, the first adhesive layer 114 has a thickness of 3 mm. In some embodiments, the first adhesive layer 114 has a thickness of 3.5 mm. In some embodiments, the first adhesive layer 114 has a thickness of 4 mm.

In another embodiment, the first adhesive layer 114 has a thickness of 1 μm to 900 μm. In some embodiments, the first adhesive layer 114 has a thickness of 1 μm to 900 μm. In some embodiments, the first adhesive layer 114 has a thickness of 1 μm to 850 μm. In some embodiments, the first adhesive layer 114 has a thickness of 1 μm to 800 μm. In some embodiments, the first adhesive layer 114 has a thickness of 1 μm to 750 μm. In some embodiments, the first adhesive layer 114 has a thickness of 1 μm to 700 μm. In some embodiments, the first adhesive layer 114 has a thickness of 1 μm to 650 μm. In some embodiments, the first adhesive layer 114 has a thickness of 1 μm to 600 μm. In some embodiments, the first adhesive layer 114 has a thickness of 1 μm to 550 μm. In some embodiments, the first adhesive layer 114 has a thickness of 1 μm to 500 μm. In some embodiments, the first adhesive layer 114 has a thickness of 1 μm to 450 μm. In some embodiments, the first adhesive layer 114 has a thickness of 1 μm to 400 μm. In some embodiments, the first adhesive layer 114 has a thickness of 1 μm to 350 μm. In some embodiments, the first adhesive layer 114 has a thickness of 1 μm to 300 μm. In some embodiments, the first adhesive layer 114 has a thickness of 1 μm to 250 μm. In some embodiments, the first adhesive layer 114 has a thickness of 1 μm to 200 μm. In some embodiments, the first adhesive layer 114 has a thickness of 1 μm to 150 μm. In some embodiments, the first adhesive layer 114 has a thickness of 1 μm to 100 μm. In some embodiments, the first adhesive layer 114 has a thickness of 1 μm to 50 μm.

In some embodiments, the first adhesive layer 114 has a thickness of 50 μm to 900 μm. In some embodiments, the first adhesive layer 114 has a thickness of 50 μm to 850 μm. In some embodiments, the first adhesive layer 114 has a thickness of 50 μm to 800 μm. In some embodiments, the first adhesive layer 114 has a thickness of 50 μm to 750 μm. In some embodiments, the first adhesive layer 114 has a thickness of 50 μm to 700 μm. In some embodiments, the first adhesive layer 114 has a thickness of 50 μm to 650 μm. In some embodiments, the first adhesive layer 114 has a thickness of 50 μm to 600 μm. In some embodiments, the first adhesive layer 114 has a thickness of 50 μm to 550 μm. In some embodiments, the first adhesive layer 114 has a thickness of 50 μm to 500 μm. In some embodiments, the first adhesive layer 114 has a thickness of 50 μm to 450 μm. In some embodiments, the first adhesive layer 114 has a thickness of 50 μm to 400 μm. In some embodiments, the first adhesive layer 114 has a thickness of 50 μm to 350 μm. In some embodiments, the first adhesive layer 114 has a thickness of 50 μm to 300 μm. In some embodiments, the first adhesive layer 114 has a thickness of 50 μm to 250 μm. In some embodiments, the first adhesive layer 114 has a thickness of 50 μm to 200 μm. In some embodiments, the first adhesive layer 114 has a thickness of 50 μm to 150 μm. In some embodiments, the first adhesive layer 114 has a thickness of 50 μm to 100 μm.

In some embodiments, the first adhesive layer 114 has a thickness of 100 μm to 900 μm. In some embodiments, the first adhesive layer 114 has a thickness of 100 μm to 850 μm. In some embodiments, the first adhesive layer 114 has a thickness of 100 μm to 800 μm. In some embodiments, the first adhesive layer 114 has a thickness of 100 μm to 750 μm. In some embodiments, the first adhesive layer 114 has a thickness of 100 μm to 700 μm. In some embodiments, the first adhesive layer 114 has a thickness of 100 μm to 650 μm. In some embodiments, the first adhesive layer 114 has a thickness of 100 μm to 600 μm. In some embodiments, the first adhesive layer 114 has a thickness of 100 μm to 550 μm. In some embodiments, the first adhesive layer 114 has a thickness of 100 μm to 500 μm. In some embodiments, the first adhesive layer 114 has a thickness of 100 μm to 450 μm. In some embodiments, the first adhesive layer 114 has a thickness of 100 μm to 400 μm. In some embodiments, the first adhesive layer 114 has a thickness of 100 μm to 350 μm. In some embodiments, the first adhesive layer 114 has a thickness of 100 μm to 300 μm. In some embodiments, the first adhesive layer 114 has a thickness of 100 μm to 250 μm. In some embodiments, the first adhesive layer 114 has a thickness of 100 μm to 200 μm. In some embodiments, the first adhesive layer 114 has a thickness of 100 μm to 150 μm.

In some embodiments, the first adhesive layer 114 has a thickness of 150 μm to 900 μm. In some embodiments, the first adhesive layer 114 has a thickness of 150 μm to 850 μm. In some embodiments, the first adhesive layer 114 has a thickness of 150 μm to 800 μm. In some embodiments, the first adhesive layer 114 has a thickness of 150 μm to 750 μm. In some embodiments, the first adhesive layer 114 has a thickness of 150 μm to 700 μm. In some embodiments, the first adhesive layer 114 has a thickness of 150 μm to 650 μm. In some embodiments, the first adhesive layer 114 has a thickness of 150 μm to 600 μm. In some embodiments, the first adhesive layer 114 has a thickness of 150 μm to 550 μm. In some embodiments, the first adhesive layer 114 has a thickness of 150 μm to 500 μm. In some embodiments, the first adhesive layer 114 has a thickness of 150 μm to 450 μm. In some embodiments, the first adhesive layer 114 has a thickness of 150 μm to 400 μm. In some embodiments, the first adhesive layer 114 has a thickness of 150 μm to 350 μm. In some embodiments, the first adhesive layer 114 has a thickness of 150 μm to 300 μm. In some embodiments, the first adhesive layer 114 has a thickness of 150 μm to 250 μm. In some embodiments, the first adhesive layer 114 has a thickness of 150 μm to 200 μm.

In some embodiments, the first adhesive layer 114 has a thickness of 200 μm to 900 μm. In some embodiments, the first adhesive layer 114 has a thickness of 200 μm to 850 μm. In some embodiments, the first adhesive layer 114 has a thickness of 200 μm to 800 μm. In some embodiments, the first adhesive layer 114 has a thickness of 200 μm to 750 μm. In some embodiments, the first adhesive layer 114 has a thickness of 200 μm to 700 μm. In some embodiments, the first adhesive layer 114 has a thickness of 200 μm to 650 μm. In some embodiments, the first adhesive layer 114 has a thickness of 200 μm to 600 μm. In some embodiments, the first adhesive layer 114 has a thickness of 200 μm to 550 μm. In some embodiments, the first adhesive layer 114 has a thickness of 200 μm to 500 μm. In some embodiments, the first adhesive layer 114 has a thickness of 200 μm to 450 μm. In some embodiments, the first adhesive layer 114 has a thickness of 200 μm to 400 μm. In some embodiments, the first adhesive layer 114 has a thickness of 200 μm to 350 μm. In some embodiments, the first adhesive layer 114 has a thickness of 200 μm to 300 μm. In some embodiments, the first adhesive layer 114 has a thickness of 200 μm to 250 μm.

In some embodiments, the first adhesive layer 114 has a thickness of 250 μm to 900 μm. In some embodiments, the first adhesive layer 114 has a thickness of 250 μm to 850 μm. In some embodiments, the first adhesive layer 114 has a thickness of 250 μm to 800 μm. In some embodiments, the first adhesive layer 114 has a thickness of 250 μm to 750 μm. In some embodiments, the first adhesive layer 114 has a thickness of 250 μm to 700 μm. In some embodiments, the first adhesive layer 114 has a thickness of 250 μm to 650 μm. In some embodiments, the first adhesive layer 114 has a thickness of 250 μm to 600 μm. In some embodiments, the first adhesive layer 114 has a thickness of 250 μm to 550 μm. In some embodiments, the first adhesive layer 114 has a thickness of 250 μm to 500 μm. In some embodiments, the first adhesive layer 114 has a thickness of 250 μm to 450 μm. In some embodiments, the first adhesive layer 114 has a thickness of 250 μm to 400 μm. In some embodiments, the first adhesive layer 114 has a thickness of 250 μm to 350 μm. In some embodiments, the first adhesive layer 114 has a thickness of 250 μm to 300 μm.

In some embodiments, the first adhesive layer 114 has a thickness of 300 μm to 900 μm. In some embodiments, the first adhesive layer 114 has a thickness of 300 μm to 850 μm. In some embodiments, the first adhesive layer 114 has a thickness of 300 μm to 800 μm. In some embodiments, the first adhesive layer 114 has a thickness of 300 μm to 750 μm. In some embodiments, the first adhesive layer 114 has a thickness of 300 μm to 700 μm. In some embodiments, the first adhesive layer 114 has a thickness of 300 µm to 650 µm. In some embodiments, the first adhesive layer 114 has a thickness of 300 µm to 600 µm. In some embodiments, the first adhesive layer 114 has a thickness of 300 µm to 550 µm. In some embodiments, the first adhesive layer 114 has a thickness of 300 µm to 500 µm. In some embodiments, the first adhesive layer 114 has a thickness of 300 µm to 450 µm. In some embodiments, the first adhesive layer 114 has a thickness of 300 µm to 400 µm. In some embodiments, the first adhesive layer 114 has a thickness of 300 µm to 350 µm.

In some embodiments, the first adhesive layer 114 has a thickness of 350 µm to 900 µm. In some embodiments, the first adhesive layer 114 has a thickness of 350 µm to 850 µm. In some embodiments, the first adhesive layer 114 has a thickness of 350 µm to 800 µm. In some embodiments, the first adhesive layer 114 has a thickness of 350 µm to 750 µm. In some embodiments, the first adhesive layer 114 has a thickness of 350 µm to 700 µm. In some embodiments, the first adhesive layer 114 has a thickness of 350 µm to 650 µm. In some embodiments, the first adhesive layer 114 has a thickness of 350 µm to 600 µm. In some embodiments, the first adhesive layer 114 has a thickness of 350 µm to 550 µm. In some embodiments, the first adhesive layer 114 has a thickness of 350 µm to 500 µm. In some embodiments, the first adhesive layer 114 has a thickness of 350 µm to 450 µm. In some embodiments, the first adhesive layer 114 has a thickness of 350 µm to 400 µm.

In some embodiments, the first adhesive layer 114 has a thickness of 400 µm to 900 µm. In some embodiments, the first adhesive layer 114 has a thickness of 400 µm to 850 µm. In some embodiments, the first adhesive layer 114 has a thickness of 400 µm to 800 µm. In some embodiments, the first adhesive layer 114 has a thickness of 400 µm to 750 µm. In some embodiments, the first adhesive layer 114 has a thickness of 400 µm to 700 µm. In some embodiments, the first adhesive layer 114 has a thickness of 400 µm to 650 µm. In some embodiments, the first adhesive layer 114 has a thickness of 400 µm to 600 µm. In some embodiments, the first adhesive layer 114 has a thickness of 400 µm to 550 µm. In some embodiments, the first adhesive layer 114 has a thickness of 400 µm to 500 µm. In some embodiments, the first adhesive layer 114 has a thickness of 400 µm to 450 µm.

In some embodiments, the first adhesive layer 114 has a thickness of 450 µm to 900 µm. In some embodiments, the first adhesive layer 114 has a thickness of 450 µm to 850 µm. In some embodiments, the first adhesive layer 114 has a thickness of 450 µm to 800 µm. In some embodiments, the first adhesive layer 114 has a thickness of 450 µm to 750 µm. In some embodiments, the first adhesive layer 114 has a thickness of 450 µm to 700 µm. In some embodiments, the first adhesive layer 114 has a thickness of 450 µm to 650 µm. In some embodiments, the first adhesive layer 114 has a thickness of 450 µm to 600 µm. In some embodiments, the first adhesive layer 114 has a thickness of 450 µm to 550 µm. In some embodiments, the first adhesive layer 114 has a thickness of 450 µm to 500 µm.

In some embodiments, the first adhesive layer 114 has a thickness of 500 µm to 900 µm. In some embodiments, the first adhesive layer 114 has a thickness of 500 µm to 850 µm. In some embodiments, the first adhesive layer 114 has a thickness of 500 µm to 800 µm. In some embodiments, the first adhesive layer 114 has a thickness of 500 µm to 750 µm. In some embodiments, the first adhesive layer 114 has a thickness of 500 µm to 700 µm. In some embodiments, the first adhesive layer 114 has a thickness of 500 µm to 650 µm. In some embodiments, the first adhesive layer 114 has a thickness of 500 µm to 600 µm. In some embodiments, the first adhesive layer 114 has a thickness of 500 µm to 550 µm.

In some embodiments, the first adhesive layer 114 has a thickness of 550 µm to 900 µm. In some embodiments, the first adhesive layer 114 has a thickness of 550 µm to 850 µm. In some embodiments, the first adhesive layer 114 has a thickness of 550 µm to 800 µm. In some embodiments, the first adhesive layer 114 has a thickness of 550 µm to 750 µm. In some embodiments, the first adhesive layer 114 has a thickness of 550 µm to 700 µm. In some embodiments, the first adhesive layer 114 has a thickness of 550 µm to 650 µm. In some embodiments, the first adhesive layer 114 has a thickness of 550 µm to 600 µm.

In some embodiments, the first adhesive layer 114 has a thickness of 600 µm to 900 µm. In some embodiments, the first adhesive layer 114 has a thickness of 600 µm to 850 µm. In some embodiments, the first adhesive layer 114 has a thickness of 600 µm to 800 µm. In some embodiments, the first adhesive layer 114 has a thickness of 600 µm to 750 µm. In some embodiments, the first adhesive layer 114 has a thickness of 600 µm to 700 µm. In some embodiments, the first adhesive layer 114 has a thickness of 600 µm to 650 µm.

In some embodiments, the first adhesive layer 114 has a thickness of 650 µm to 900 µm. In some embodiments, the first adhesive layer 114 has a thickness of 650 µm to 850 µm. In some embodiments, the first adhesive layer 114 has a thickness of 650 µm to 800 µm. In some embodiments, the first adhesive layer 114 has a thickness of 650 µm to 750 µm. In some embodiments, the first adhesive layer 114 has a thickness of 650 µm to 700 µm. In some embodiments, the first adhesive layer 114 has a thickness of 700 µm to 900 µm. In some embodiments, the first adhesive layer 114 has a thickness of 700 µm to 850 µm. In some embodiments, the first adhesive layer 114 has a thickness of 700 µm to 800 µm. In some embodiments, the first adhesive layer 114 has a thickness of 700 µm to 750 µm. In some embodiments, the first adhesive layer 114 has a thickness of 750 µm to 900 µm. In some embodiments, the first adhesive layer 114 has a thickness of 750 µm to 850 µm. In some embodiments, the first adhesive layer 114 has a thickness of 750 µm to 800 µm. In some embodiments, the first adhesive layer 114 has a thickness of 800 µm to 900 µm. In some embodiments, the first adhesive layer 114 has a thickness of 800 µm to 850 µm. In some embodiments, the first adhesive layer 114 has a thickness of 850 µm to 900 µm.

In some embodiments, the first adhesive layer 114 has a thickness of 1 µm. In some embodiments, the first adhesive layer 114 has a thickness of 50 µm. In some embodiments, the first adhesive layer 114 has a thickness of 100 µm. In some embodiments, the first adhesive layer 114 has a thickness of 1 µm. In some embodiments, the first adhesive layer 114 has a thickness of 150 µm. In some embodiments, the first adhesive layer 114 has a thickness of 200 µm. In some embodiments, the first adhesive layer 114 has a thickness of 250 µm. In some embodiments, the first adhesive layer 114 has a thickness of 300 µm. In some embodiments, the first adhesive layer 114 has a thickness of 350 µm. In some embodiments, the first adhesive layer 114 has a thickness of 400 µm. In some embodiments, the first adhesive layer 114 has a thickness of 450 µm. In some embodiments, the first adhesive layer 114 has a thickness of 500 µm. In some embodiments, the first adhesive layer 114 has a thickness of 550 µm. In some embodiments, the first adhesive layer 114 has a thickness of 600 µm. In some embodiments, the first adhesive layer 114 has a thickness of 650 µm. In some embodiments, the first adhesive layer 114 has a thickness of 700 µm. In some embodiments, the first adhesive layer 114 has a thickness of 750 μm. In some embodiments, the first adhesive layer 114 has a thickness of 800 μm. In some embodiments, the first adhesive layer 114 has a thickness of 850 μm. In some embodiments, the first adhesive layer 114 has a thickness of 900 μm.

In some embodiments, the second adhesive layer 116 may include polyvinyl butyrate, acrylic, silicone, or polycarbonate. In another embodiment, the second adhesive layer 116 may include pressure sensitive adhesives.

In some embodiments, the second adhesive layer 116 comprises at least one of thermosetting polyolefin, thermosetting polyolefin encapsulant material, thermosetting ethylene-vinyl acetate (EVA), EVA encapsulants, thermoplastic olefin, thermoplastic polyolefin (TPO), any hybrids thereof, any combinations thereof.

In some embodiments, the second adhesive layer 116 has a thickness of 0.2 mm to 2 mm. In some embodiments, the second adhesive layer 116 has a thickness of 0.2 mm to 1.5 mm. In some embodiments, the second adhesive layer 116 has a thickness of 0.2 mm to 1 mm. In some embodiments, the second adhesive layer 116 has a thickness of 0.2 mm to 0.5 mm. In some embodiments, the second adhesive layer 116 has a thickness of 0.5 mm to 2 mm. In some embodiments, the second adhesive layer 116 has a thickness of 0.5 mm to 1.5 mm. In some embodiments, the second adhesive layer 116 has a thickness of 0.5 mm to 1 mm. In some embodiments, the second adhesive layer 116 has a thickness of 1 mm to 2 mm. In some embodiments, the second adhesive layer 116 has a thickness of 1 mm to 1.5 mm. In some embodiments, the second adhesive layer 116 has a thickness of 1.5 mm to 2 mm.

In some embodiments, the second adhesive layer 116 has a thickness of 0.2 mm. In some embodiments, the second adhesive layer 116 has a thickness of 0.3 mm. In some embodiments, the second adhesive layer 116 has a thickness of 0.4 mm. In some embodiments, the second adhesive layer 116 has a thickness of 0.45 mm. In some embodiments, the second adhesive layer 116 has a thickness of 0.5 mm. In some embodiments, the second adhesive layer 116 has a thickness of 1 mm. In some embodiments, the second adhesive layer 116 has a thickness of 1.5 mm. In some embodiments, the second adhesive layer 116 has a thickness of 2 mm. In some embodiments, the second adhesive layer 116 has a thickness of 2.5 mm. In some embodiments, the second adhesive layer 116 has a thickness of 3 mm. In some embodiments, the second adhesive layer 116 has a thickness of 3.5 mm. In some embodiments, the second adhesive layer 116 has a thickness of 4 mm.

In some embodiments, the second adhesive layer 116 has a thickness of 1 μm to 900 μm. In some embodiments, the second adhesive layer 116 has a thickness of 1 μm to 900 μm. In some embodiments, the second adhesive layer 116 has a thickness of 1 μm to 850 μm. In some embodiments, the second adhesive layer 116 has a thickness of 1 μm to 800 μm. In some embodiments, the second adhesive layer 116 has a thickness of 1 μm to 750 μm. In some embodiments, the second adhesive layer 116 has a thickness of 1 μm to 700 μm. In some embodiments, the second adhesive layer 116 has a thickness of 1 μm to 650 μm. In some embodiments, the second adhesive layer 116 has a thickness of 1 μm to 600 μm. In some embodiments, the second adhesive layer 116 has a thickness of 1 μm to 550 μm. In some embodiments, the second adhesive layer 116 has a thickness of 1 μm to 500 μm. In some embodiments, the second adhesive layer 116 has a thickness of 1 μm to 450 μm. In some embodiments, the second adhesive layer 116 has a thickness of 1 μm to 400 μm. In some embodiments, the second adhesive layer 116 has a thickness of 1 μm to 350 μm. In some embodiments, the second adhesive layer 116 has a thickness of 1 μm to 300 μm. In some embodiments, the second adhesive layer 116 has a thickness of 1 μm to 250 μm. In some embodiments, the second adhesive layer 116 has a thickness of 1 μm to 200 μm. In some embodiments, the second adhesive layer 116 has a thickness of 1 μm to 150 μm. In some embodiments, the second adhesive layer 116 has a thickness of 1 μm to 100 μm. In some embodiments, the second adhesive layer 116 has a thickness of 1 μm to 50 μm.

In some embodiments, the second adhesive layer 116 has a thickness of 50 μm to 900 μm. In some embodiments, the second adhesive layer 116 has a thickness of 50 μm to 850 μm. In some embodiments, the second adhesive layer 116 has a thickness of 50 μm to 800 μm. In some embodiments, the second adhesive layer 116 has a thickness of 50 μm to 750 μm. In some embodiments, the second adhesive layer 116 has a thickness of 50 μm to 700 μm. In some embodiments, the second adhesive layer 116 has a thickness of 50 μm to 650 μm. In some embodiments, the second adhesive layer 116 has a thickness of 50 μm to 600 μm. In some embodiments, the second adhesive layer 116 has a thickness of 50 μm to 550 μm. In some embodiments, the second adhesive layer 116 has a thickness of 50 μm to 500 μm. In some embodiments, the second adhesive layer 116 has a thickness of 50 μm to 450 μm. In some embodiments, the second adhesive layer 116 has a thickness of 50 μm to 400 μm. In some embodiments, the second adhesive layer 116 has a thickness of 50 μm to 350 μm. In some embodiments, the second adhesive layer 116 has a thickness of 50 μm to 300 μm. In some embodiments, the second adhesive layer 116 has a thickness of 50 μm to 250 μm. In some embodiments, the second adhesive layer 116 has a thickness of 50 μm to 200 μm. In some embodiments, the second adhesive layer 116 has a thickness of 50 μm to 150 μm. In some embodiments, the second adhesive layer 116 has a thickness of 50 μm to 100 μm.

In some embodiments, the second adhesive layer 116 has a thickness of 100 μm to 900 μm. In some embodiments, the second adhesive layer 116 has a thickness of 100 μm to 850 μm. In some embodiments, the second adhesive layer 116 has a thickness of 100 μm to 800 μm. In some embodiments, the second adhesive layer 116 has a thickness of 100 μm to 750 μm. In some embodiments, the second adhesive layer 116 has a thickness of 100 μm to 700 μm. In some embodiments, the second adhesive layer 116 has a thickness of 100 μm to 650 μm. In some embodiments, the second adhesive layer 116 has a thickness of 100 μm to 600 μm. In some embodiments, the second adhesive layer 116 has a thickness of 100 μm to 550 μm. In some embodiments, the second adhesive layer 116 has a thickness of 100 μm to 500 μm. In some embodiments, the second adhesive layer 116 has a thickness of 100 μm to 450 μm. In some embodiments, the second adhesive layer 116 has a thickness of 100 μm to 400 μm. In some embodiments, the second adhesive layer 116 has a thickness of 100 μm to 350 μm. In some embodiments, the second adhesive layer 116 has a thickness of 100 μm to 300 μm. In some embodiments, the second adhesive layer 116 has a thickness of 100 μm to 250 μm. In some embodiments, the second adhesive layer 116 has a thickness of 100 μm to 200 μm. In some embodiments, the second adhesive layer 116 has a thickness of 100 μm to 150 μm.

In some embodiments, the second adhesive layer 116 has a thickness of 150 μm to 900 μm. In some embodiments, the second adhesive layer 116 has a thickness of 150 μm to 850 μm. In some embodiments, the second adhesive layer 116 has a thickness of 150 μm to 800 μm. In some embodiments, the second adhesive layer 116 has a thickness of 150 μm to 750 μm. In some embodiments, the second adhesive layer 116 has a thickness of 150 μm to 700 μm. In some embodiments, the second adhesive layer 116 has a thickness of 150 μm to 650 μm. In some embodiments, the second adhesive layer 116 has a thickness of 150 μm to 600 μm. In some embodiments, the second adhesive layer 116 has a thickness of 150 μm to 550 μm. In some embodiments, the second adhesive layer 116 has a thickness of 150 μm to 500 μm. In some embodiments, the second adhesive layer 116 has a thickness of 150 μm to 450 μm. In some embodiments, the second adhesive layer 116 has a thickness of 150 μm to 400 μm. In some embodiments, the second adhesive layer 116 has a thickness of 150 μm to 350 μm. In some embodiments, the second adhesive layer 116 has a thickness of 150 μm to 300 μm. In some embodiments, the second adhesive layer 116 has a thickness of 150 μm to 250 μm. In some embodiments, the second adhesive layer 116 has a thickness of 150 μm to 200 μm.

In some embodiments, the second adhesive layer 116 has a thickness of 200 μm to 900 μm. In some embodiments, the second adhesive layer 116 has a thickness of 200 μm to 850 μm. In some embodiments, the second adhesive layer 116 has a thickness of 200 μm to 800 μm. In some embodiments, the second adhesive layer 116 has a thickness of 200 μm to 750 μm. In some embodiments, the second adhesive layer 116 has a thickness of 200 μm to 700 μm. In some embodiments, the second adhesive layer 116 has a thickness of 200 μm to 650 μm. In some embodiments, the second adhesive layer 116 has a thickness of 200 μm to 600 μm. In some embodiments, the second adhesive layer 116 has a thickness of 200 μm to 550 μm. In some embodiments, the second adhesive layer 116 has a thickness of 200 μm to 500 μm. In some embodiments, the second adhesive layer 116 has a thickness of 200 μm to 450 μm. In some embodiments, the second adhesive layer 116 has a thickness of 200 μm to 400 μm. In some embodiments, the second adhesive layer 116 has a thickness of 200 μm to 350 μm. In some embodiments, the second adhesive layer 116 has a thickness of 200 μm to 300 μm. In some embodiments, the second adhesive layer 116 has a thickness of 200 μm to 250 μm.

In some embodiments, the second adhesive layer 116 has a thickness of 250 μm to 900 μm. In some embodiments, the second adhesive layer 116 has a thickness of 250 μm to 850 μm. In some embodiments, the second adhesive layer 116 has a thickness of 250 μm to 800 μm. In some embodiments, the second adhesive layer 116 has a thickness of 250 μm to 750 μm. In some embodiments, the second adhesive layer 116 has a thickness of 250 μm to 700 μm. In some embodiments, the second adhesive layer 116 has a thickness of 250 μm to 650 μm. In some embodiments, the second adhesive layer 116 has a thickness of 250 μm to 600 μm. In some embodiments, the second adhesive layer 116 has a thickness of 250 μm to 550 μm. In some embodiments, the second adhesive layer 116 has a thickness of 250 μm to 500 μm. In some embodiments, the second adhesive layer 116 has a thickness of 250 μm to 450 μm. In some embodiments, the second adhesive layer 116 has a thickness of 250 μm to 400 μm. In some embodiments, the second adhesive layer 116 has a thickness of 250 μm to 350 μm. In some embodiments, the second adhesive layer 116 has a thickness of 250 μm to 300 μm.

In some embodiments, the second adhesive layer 116 has a thickness of 300 μm to 900 μm. In some embodiments, the second adhesive layer 116 has a thickness of 300 μm to 850 μm. In some embodiments, the second adhesive layer 116 has a thickness of 300 μm to 800 μm. In some embodiments, the second adhesive layer 116 has a thickness of 300 μm to 750 μm. In some embodiments, the second adhesive layer 116 has a thickness of 300 μm to 700 μm. In some embodiments, the second adhesive layer 116 has a thickness of 300 μm to 650 μm. In some embodiments, the second adhesive layer 116 has a thickness of 300 μm to 600 μm. In some embodiments, the second adhesive layer 116 has a thickness of 300 μm to 550 μm. In some embodiments, the second adhesive layer 116 has a thickness of 300 μm to 500 μm. In some embodiments, the second adhesive layer 116 has a thickness of 300 μm to 450 μm. In some embodiments, the second adhesive layer 116 has a thickness of 300 μm to 400 μm. In some embodiments, the second adhesive layer 116 has a thickness of 300 μm to 350 μm.

In some embodiments, the second adhesive layer 116 has a thickness of 350 μm to 900 μm. In some embodiments, the second adhesive layer 116 has a thickness of 350 μm to 850 μm. In some embodiments, the second adhesive layer 116 has a thickness of 350 μm to 800 μm. In some embodiments, the second adhesive layer 116 has a thickness of 350 μm to 750 μm. In some embodiments, the second adhesive layer 116 has a thickness of 350 μm to 700 μm. In some embodiments, the second adhesive layer 116 has a thickness of 350 μm to 650 μm. In some embodiments, the second adhesive layer 116 has a thickness of 350 μm to 600 μm. In some embodiments, the second adhesive layer 116 has a thickness of 350 μm to 550 μm. In some embodiments, the second adhesive layer 116 has a thickness of 350 μm to 500 μm. In some embodiments, the second adhesive layer 116 has a thickness of 350 μm to 450 μm. In some embodiments, the second adhesive layer 116 has a thickness of 350 μm to 400 μm.

In some embodiments, the second adhesive layer 116 has a thickness of 400 μm to 900 μm. In some embodiments, the second adhesive layer 116 has a thickness of 400 μm to 850 μm. In some embodiments, the second adhesive layer 116 has a thickness of 400 μm to 800 μm. In some embodiments, the second adhesive layer 116 has a thickness of 400 μm to 750 μm. In some embodiments, the second adhesive layer 116 has a thickness of 400 μm to 700 μm. In some embodiments, the second adhesive layer 116 has a thickness of 400 μm to 650 μm. In some embodiments, the second adhesive layer 116 has a thickness of 400 μm to 600 μm. In some embodiments, the second adhesive layer 116 has a thickness of 400 μm to 550 μm. In some embodiments, the second adhesive layer 116 has a thickness of 400 μm to 500 μm. In some embodiments, the second adhesive layer 116 has a thickness of 400 μm to 450 μm.

In some embodiments, the second adhesive layer 116 has a thickness of 450 μm to 900 μm. In some embodiments, the second adhesive layer 116 has a thickness of 450 μm to 850 μm. In some embodiments, the second adhesive layer 116 has a thickness of 450 μm to 800 μm. In some embodiments, the second adhesive layer 116 has a thickness of 450 μm to 750 μm. In some embodiments, the second adhesive layer 116 has a thickness of 450 μm to 700 μm. In some embodiments, the second adhesive layer 116 has a thickness of 450 μm to 650 μm. In some embodiments, the second adhesive layer 116 has a thickness of 450 μm to 600 μm. In some embodiments, the second adhesive layer 116 has a thickness of 450 μm to 550 μm. In some embodiments, the second adhesive layer 116 has a thickness of 450 μm to 500 μm.

In some embodiments, the second adhesive layer 116 has a thickness of 500 μm to 900 μm. In some embodiments, the second adhesive layer 116 has a thickness of 500 μm to 850 μm. In some embodiments, the second adhesive layer 116 has a thickness of 500 μm to 800 μm. In some embodiments, the second adhesive layer 116 has a thickness of 500 µm to 750 µm. In some embodiments, the second adhesive layer 116 has a thickness of 500 µm to 700 µm. In some embodiments, the second adhesive layer 116 has a thickness of 500 µm to 650 µm. In some embodiments, the second adhesive layer 116 has a thickness of 500 µm to 600 µm. In some embodiments, the second adhesive layer 116 has a thickness of 500 µm to 550 µm.

In some embodiments, the second adhesive layer 116 has a thickness of 550 µm to 900 µm. In some embodiments, the second adhesive layer 116 has a thickness of 550 µm to 850 µm. In some embodiments, the second adhesive layer 116 has a thickness of 550 µm to 800 µm. In some embodiments, the second adhesive layer 116 has a thickness of 550 µm to 750 µm. In some embodiments, the second adhesive layer 116 has a thickness of 550 µm to 700 µm. In some embodiments, the second adhesive layer 116 has a thickness of 550 µm to 650 µm. In some embodiments, the second adhesive layer 116 has a thickness of 550 µm to 600 µm.

In some embodiments, the second adhesive layer 116 has a thickness of 600 µm to 900 µm. In some embodiments, the second adhesive layer 116 has a thickness of 600 µm to 850 µm. In some embodiments, the second adhesive layer 116 has a thickness of 600 µm to 800 µm. In some embodiments, the second adhesive layer 116 has a thickness of 600 µm to 750 µm. In some embodiments, the second adhesive layer 116 has a thickness of 600 µm to 700 µm. In some embodiments, the second adhesive layer 116 has a thickness of 600 µm to 650 µm.

In some embodiments, the second adhesive layer 116 has a thickness of 650 µm to 900 µm. In some embodiments, the second adhesive layer 116 has a thickness of 650 µm to 850 µm. In some embodiments, the second adhesive layer 116 has a thickness of 650 µm to 800 µm. In some embodiments, the second adhesive layer 116 has a thickness of 650 µm to 750 µm. In some embodiments, the second adhesive layer 116 has a thickness of 650 µm to 700 µm. In some embodiments, the second adhesive layer 116 has a thickness of 700 µm to 900 µm. In some embodiments, the second adhesive layer 116 has a thickness of 700 µm to 850 µm. In some embodiments, the second adhesive layer 116 has a thickness of 700 µm to 800 µm. In some embodiments, the second adhesive layer 116 has a thickness of 700 µm to 750 µm. In some embodiments, the second adhesive layer 116 has a thickness of 750 µm to 900 µm. In some embodiments, the second adhesive layer 116 has a thickness of 750 µm to 850 µm. In some embodiments, the second adhesive layer 116 has a thickness of 750 µm to 800 µm. In some embodiments, the second adhesive layer 116 has a thickness of 800 µm to 900 µm. In some embodiments, the second adhesive layer 116 has a thickness of 800 µm to 850 µm. In some embodiments, the second adhesive layer 116 has a thickness of 850 µm to 900 µm.

In some embodiments, the second adhesive layer 116 has a thickness of 1 µm. In some embodiments, the second adhesive layer 116 has a thickness of 50 µm. In some embodiments, the second adhesive layer 116 has a thickness of 100 µm. In some embodiments, the second adhesive layer 116 has a thickness of 1 µm. In some embodiments, the second adhesive layer 116 has a thickness of 150 µm. In some embodiments, the second adhesive layer 116 has a thickness of 200 µm. In some embodiments, the second adhesive layer 116 has a thickness of 250 µm. In some embodiments, the second adhesive layer 116 has a thickness of 300 µm. In some embodiments, the second adhesive layer 116 has a thickness of 350 µm. In some embodiments, the second adhesive layer 116 has a thickness of 400 µm. In some embodiments, the second adhesive layer 116 has a thickness of 450 µm. In some embodiments, the second adhesive layer 116 has a thickness of 500 µm. In some embodiments, the second adhesive layer 116 has a thickness of 550 µm. In some embodiments, the second adhesive layer 116 has a thickness of 600 µm. In some embodiments, the second adhesive layer 116 has a thickness of 650 µm. In some embodiments, the second adhesive layer 116 has a thickness of 700 µm. In some embodiments, the second adhesive layer 116 has a thickness of 750 µm. In some embodiments, the second adhesive layer 116 has a thickness of 800 µm. In some embodiments, the second adhesive layer 116 has a thickness of 850 µm. In some embodiments, the second adhesive layer 116 has a thickness of 900 µm.

In some embodiments, the second adhesive layer 116 covers at least a portion of the exposed portions of the anti-reflective coating. In some embodiments, the second adhesive layer 116 permits at least a portion of the solar radiation or light to pass through the second adhesive layer 116 to the anti-reflective coating 110. In some embodiments, the second adhesive layer 116 is transparent or at least partially transparent to solar radiation or light (e.g., at least one of infrared light, near-infrared light, far-infrared light, ultraviolet light, visible light, or any combination thereof). In some embodiments, the second adhesive layer 116 is transmissive or at least partially transmissive to solar radiation or light (e.g., at least one of infrared light, near-infrared light, far-infrared light, ultraviolet light, visible light, or any combination thereof). In some embodiments, the second adhesive layer 116 absorbs or at least partially absorbs solar radiation or light (e.g., at least one of infrared light, near-infrared light, far-infrared light, ultraviolet light, visible light, or any combination thereof). In some embodiments, the second adhesive layer 116 comprises an adhesive located between the plurality of protrusions 112 and the anti-reflective coating 110. In some embodiments, the second adhesive layer 116 comprises an adhesive located between the plurality of protrusions 112 and the anti-reflective coating 110, such that the second adhesive layer 116 does not cover all or at least a portion of the exposed portions of the anti-reflective coating 110. In some embodiments, the second adhesive layer 116 comprises an anti-reflective adhesive layer.

In some embodiments, the backsheet 104 comprises a single layer. In some embodiments, the backsheet 104 comprises a plurality of layers. In some embodiments, the backsheet 104 comprises a first layer 128. In some embodiments, the backsheet 104 comprises a second layer 130. In some embodiments, the backsheet 104 comprises a third layer 132. In some embodiments, the second layer 130 of the backsheet 104 is located between the encapsulated solar cell 106 and the third layer 132 of the backsheet 104. In some embodiments, the third layer 132 of the backsheet 104 is located between the second layer 130 of the backsheet 104 and the first layer 128 of the backsheet 104. In some embodiments, the first layer 128 of the backsheet 104 is located between the third layer 132 of the backsheet 104 and the roof deck. In some embodiments, the second layer 130 of the backsheet 104 directly contacts the encapsulated solar cell 106. In some embodiments, the second layer 130 of the backsheet 104 directly contacts the third layer 132 of the backsheet 104. In some embodiments, the third layer 132 of the backsheet 104 directly contacts the first layer 128 of the backsheet 104. In some embodiments, the first layer 128 of the backsheet 104 directly contacts the roof deck. In some embodiments, the first layer 128 of the backsheet 104 is juxtaposed with the encapsulated solar cell 106.

In some embodiments, the second layer 130 of the backsheet 104 is juxtaposed with the first layer 128 of the backsheet 104. In some embodiments, the backsheet 104 only comprises the first layer 128. In some embodiments, the photovoltaic shingle 100 does not comprise the backsheet 104. In some embodiments, the third layer 132 of the backsheet 104 is an adhesive layer, including any of the adhesive layers disclosed herein.

In some embodiments, the first layer 128 of the backsheet 104 comprises a polymeric material. In some embodiments, the first layer 128 of the backsheet 104 comprises polyethylene terephthalate (PET). In some embodiments, the first layer 128 of the backsheet 104 comprises ethylene tetrafluoroethylene (ETFE). In some embodiments, the first layer 128 of the backsheet 104 comprises an acrylic such as polymethyl methacrylate (PMMA). In some embodiments, the first layer 128 of the backsheet 104 comprises thermoplastic polyolefin (TPO). In some embodiments, the first layer 128 of the backsheet 104 includes of a single ply TPO roofing membrane. In other embodiments, non-limiting examples of TPO membranes are disclosed in U.S. Pat. No. 9,359,014 to Yang et al., which is incorporated by reference herein in its entirety. In some embodiments, the first layer 128 of the backsheet 104 comprises polyvinyl chloride. In some embodiments, the first layer 128 of the backsheet 104 comprises ethylene propylene diene monomer (EPDM) rubber. In some embodiments, the first layer 128 of the backsheet 104 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the first layer 128 is white in color. In some embodiments, the first layer 128 is white TPO.

In some embodiments, the first layer 128 of the backsheet 104 has a thickness of 0.2 mm to 0.5 mm. In another embodiment, the first layer 128 of the backsheet 104 has a thickness of 0.2 mm to 0.4 mm. In another embodiment, the first layer 128 of the backsheet 104 has a thickness of 0.2 mm to 0.3 mm. In some embodiments, the first layer 128 of the backsheet 104 has a thickness of 0.3 mm to 0.5 mm. In another embodiment, the first layer 128 of the backsheet 104 has a thickness of 0.3 mm to 0.4 mm. In some embodiments, the first layer of the backsheet 104 has a thickness of 0.4 mm to 0.5 mm. In some embodiments, the first layer 128 of the backsheet 104 has a thickness of 0.2 mm. In some embodiments, the first layer 128 of the backsheet 104 has a thickness of 0.3 mm. In some embodiments, the first layer 128 of the backsheet 104 has a thickness of 0.4 mm. In some embodiments, the first layer 128 of the backsheet 104 has a thickness of 0.5 mm.

In some embodiments, the second layer 130 of the backsheet 104 comprises a polymeric material. In some embodiments, the second layer 130 of the backsheet 104 comprises thermoplastic polyolefin (TPO). In some embodiments, the second layer 130 of the backsheet 104 includes a single ply TPO roofing membrane. In other embodiments, non-limiting examples of TPO membranes are disclosed in U.S. Pat. No. 9,359,014 to Yang et al., which is incorporated by reference herein in its entirety. In another embodiment, the second layer 130 of the backsheet 104 comprises polyethylene terephthalate ("PET"). In another embodiment, the second layer 130 of the backsheet 104 comprises styrene acrylic copolymer. In another embodiment, the second layer 130 of the backsheet 104 comprises ethylene tetrafluoroethylene ("ETFE"). In some embodiments, the second layer 130 of the backsheet 104 comprises an acrylic such as polymethyl methacrylate ("PMMA"). In some embodiments, the second layer 130 of the backsheet 104 comprises polyvinyl chloride. In some embodiments, the second layer 130 of the backsheet 104 comprises ethylene propylene diene monomer (EPDM) rubber. In some embodiments, the second layer 130 of the backsheet 104 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the second layer 130 is white in color. In some embodiments, the second layer 130 is white TPO.

In some embodiments, the second layer 130 of the backsheet 104 has a thickness of 1 mm to 5 mm. In some embodiments, the second layer 130 of the backsheet 104 has a thickness of 1 mm to 4 mm. In some embodiments, the second layer 130 of the backsheet 104 has a thickness of 1 mm to 3 mm. In some embodiments, the second layer 130 of the backsheet 104 has a thickness of 1 mm to 2 mm. In some embodiments, the second layer 130 of the backsheet 104 has a thickness of 2 mm to 5 mm. In some embodiments, the second layer 130 of the backsheet 104 has a thickness of 2 mm to 4 mm. In some embodiments, the second layer 130 of the backsheet 104 has a thickness of 2 mm to 3 mm. In some embodiments, the second layer 130 of the backsheet 104 has a thickness of 3 mm to 5 mm. In some embodiments, the second layer 130 of the backsheet 104 has a thickness of 3 mm to 4 mm. In some embodiments, the second layer 130 of the backsheet 104 has a thickness of 4 mm to 5 mm. In some embodiments, the second layer 130 of the backsheet 104 has a thickness of 1 mm. In some embodiments, the second layer 130 of the backsheet 104 has a thickness of 2 mm. In some embodiments, the second layer 130 of the backsheet 104 has a thickness of 3 mm. In some embodiments, the second layer 130 of the backsheet 104 has a thickness of 4 mm. In some embodiments, the second layer 130 of the backsheet 104 has a thickness of 5 mm.

In some embodiments, the backsheet 104 has a thickness of 1 mm to 10 mm. In some embodiments, the backsheet 104 has a thickness of 1 mm to 9 mm. In some embodiments, the backsheet 104 has a thickness of 1 mm to 8 mm. In some embodiments, the backsheet 104 has a thickness of 1 mm to 7 mm. In some embodiments, the backsheet 104 has a thickness of 1 mm to 6 mm. In some embodiments, the backsheet 104 has a thickness of 4 mm to 10 mm. In some embodiments, the backsheet 104 has a thickness of 5 mm to 10 mm. In some embodiments, the backsheet 104 has a thickness of 6 mm to 10 mm. In some embodiments, the backsheet 104 has a thickness of 7 mm to 10 mm. In some embodiments, the backsheet 104 has a thickness of 8 mm to 10 mm. In some embodiments, the backsheet 104 has a thickness of 9 mm to 10 mm.

As used herein, the terms "encapsulating" and "encapsulates" mean to partially or fully envelope or enclose, and with respect to certain embodiments of the photovoltaic shingle 100, the at least one solar cell is fully enveloped by or enclosed within the encapsulant, or partially enveloped by or enclosed within the encapsulant.

In some embodiments, the encapsulated solar cell 106 comprises at least one solar cell 122 and an encapsulant encapsulating the at least one solar cell. In some embodiments, the encapsulant comprises at least one encapsulant layer. In some embodiments, the encapsulant comprises at least one of a first encapsulant layer 124, a second encapsulant layer 126, or any combination thereof. In some embodiments, the encapsulated solar cell 106 comprises at least one solar cell 122, a first encapsulant layer 124, and a second encapsulant layer 126, wherein the at least one solar cell 122 is located between the first encapsulant layer 124 and the second encapsulant layer 126. In some embodiments, the first encapsulant layer 124 is located between the glass layer 108 and the at least one solar cell 122. In some embodiments, the second encapsulant layer 126 is located between the at least one solar cell 122 and the backsheet 104. In some embodiments, the second encapsulant layer 126 is located between the at least one solar cell 122 and the second layer 130 of the backsheet 104. In some embodiments, the photovoltaic shingle 100 does not comprise the second encapsulant layer 126. In some embodiments, the backsheet 104 encapsulates at least a portion of the at least one solar cell 122. In some embodiments, the backsheet 104 is an encapsulant-backsheet layer.

In some embodiments, the first encapsulant layer 124 encapsulates 50% to 99.9% of an exterior surface area of the at least one solar cell 122. In another embodiment, the first encapsulant layer 124 encapsulates 55% to 99.9% of an exterior surface area of the at least one solar cell 122. In another embodiment, the first encapsulant layer 124 encapsulates 60% to 99.9% of an exterior surface area of the at least one solar cell 122. In another embodiment, the first encapsulant layer 124 encapsulates 65% to 99.9% of an exterior surface area of the at least one solar cell 122. In another embodiment, the first encapsulant layer 124 encapsulates 70% to 99.9% of an exterior surface area of the at least one solar cell 122. In another embodiment, the first encapsulant layer 124 encapsulates 75% to 99.9% of an exterior surface area of the at least one solar cell 122. In another embodiment, the first encapsulant layer 124 encapsulates 80% to 99.9% of an exterior surface area of the at least one solar cell 122. In another embodiment, the first encapsulant layer 124 encapsulates 85% to 99.9% of an exterior surface area of the at least one solar cell 122. In another embodiment, the first encapsulant layer 124 encapsulates 90% to 99.9% of an exterior surface area of the at least one solar cell 122. In another embodiment, the first encapsulant layer 124 encapsulates 95% to 99.9% of an exterior surface area of the at least one solar cell 122.

In another embodiment, the first encapsulant layer 124 encapsulates 50% to 95% of an exterior surface area of the at least one solar cell 122. In another embodiment, the first encapsulant layer 124 encapsulates 55% to 95% of an exterior surface area of the at least one solar cell 122. In another embodiment, the first encapsulant layer 124 encapsulates 60% to 95% of an exterior surface area of the at least one solar cell 122. In another embodiment, the first encapsulant layer 124 encapsulates 65% to 95% of an exterior surface area of the at least one solar cell 122. In another embodiment, the first encapsulant layer 124 encapsulates 70% to 95% of an exterior surface area of the at least one solar cell 122. In another embodiment, the first encapsulant layer 124 encapsulates 75% to 95% of an exterior surface area of the at least one solar cell 122. In another embodiment, the first encapsulant layer 124 encapsulates 80% to 95% of an exterior surface area of the at least one solar cell 122. In another embodiment, the first encapsulant layer 124 encapsulates 85% to 95% of an exterior surface area of the at least one solar cell 122. In another embodiment, the first encapsulant layer 124 encapsulates 90% to 95% of an exterior surface area of the at least one solar cell 122.

In another embodiment, the first encapsulant layer 124 encapsulates 50% to 90% of an exterior surface area of the at least one solar cell 122. In another embodiment, the first encapsulant layer 124 encapsulates 55% to 90% of an exterior surface area of the at least one solar cell 122. In another embodiment, the first encapsulant layer 124 encapsulates 60% to 90% of an exterior surface area of the at least one solar cell 122. In another embodiment, the first encapsulant layer 124 encapsulates 65% to 90% of an exterior surface area of the at least one solar cell 122. In another embodiment, the first encapsulant layer 124 encapsulates 70% to 90% of an exterior surface area of the at least one solar cell 122. In another embodiment, the first encapsulant layer 124 encapsulates 75% to 90% of an exterior surface area of the at least one solar cell 122. In another embodiment, the first encapsulant layer 124 encapsulates 80% to 90% of an exterior surface area of the at least one solar cell 122. In another embodiment, the first encapsulant layer 124 encapsulates 85% to 90% of an exterior surface area of the at least one solar cell 122.

In another embodiment, the first encapsulant layer 124 encapsulates 50% to 85% of an exterior surface area of the at least one solar cell 122. In another embodiment, the first encapsulant layer 124 encapsulates 55% to 85% of an exterior surface area of the at least one solar cell 122. In another embodiment, the first encapsulant layer 124 encapsulates 60% to 85% of an exterior surface area of the at least one solar cell 122. In another embodiment, the first encapsulant layer 124 encapsulates 65% to 85% of an exterior surface area of the at least one solar cell 122. In another embodiment, the first encapsulant layer 124 encapsulates 70% to 85% of an exterior surface area of the at least one solar cell 122. In another embodiment, the first encapsulant layer 124 encapsulates 75% to 85% of an exterior surface area of the at least one solar cell 122. In another embodiment, the first encapsulant layer 124 encapsulates 80% to 85% of an exterior surface area of the at least one solar cell 122.

In another embodiment, the first encapsulant layer 124 encapsulates 50% to 80% of an exterior surface area of the at least one solar cell 122. In another embodiment, the first encapsulant layer 124 encapsulates 55% to 80% of an exterior surface area of the at least one solar cell 122. In another embodiment, the first encapsulant layer 124 encapsulates 60% to 80% of an exterior surface area of the at least one solar cell 122. In another embodiment, the first encapsulant layer 124 encapsulates 65% to 80% of an exterior surface area of the at least one solar cell 122. In another embodiment, the first encapsulant layer 124 encapsulates 70% to 80% of an exterior surface area of the at least one solar cell 122. In another embodiment, the first encapsulant layer 124 encapsulates 75% to 80% of an exterior surface area of the at least one solar cell 122.

In another embodiment, the first encapsulant layer 124 encapsulates 50% to 75% of an exterior surface area of the at least one solar cell 122. In another embodiment, the first encapsulant layer 124 encapsulates 55% to 75% of an exterior surface area of the at least one solar cell 122. In another embodiment, the first encapsulant layer 124 encapsulates 60% to 75% of an exterior surface area of the at least one solar cell 122. In another embodiment, the first encapsulant layer 124 encapsulates 65% to 75% of an exterior surface area of the at least one solar cell 122. In another embodiment, the first encapsulant layer 124 encapsulates 70% to 75% of an exterior surface area of the at least one solar cell 122.

In another embodiment, the first encapsulant layer 124 encapsulates 50% to 70% of an exterior surface area of the at least one solar cell 122. In another embodiment, the first encapsulant layer 124 encapsulates 55% to 70% of an exterior surface area of the at least one solar cell 122. In another embodiment, the first encapsulant layer 124 encapsulates 60% to 70% of an exterior surface area of the at least one solar cell 122. In another embodiment, the first encapsulant layer 124 encapsulates 65% to 70% of an exterior surface area of the at least one solar cell 122.

In another embodiment, the first encapsulant layer 124 encapsulates 50% to 65% of an exterior surface area of the at least one solar cell 122. In another embodiment, the first encapsulant layer 124 encapsulates 55% to 65% of an exterior surface area of the at least one solar cell 122. In another embodiment, the first encapsulant layer 124 encapsulates 60% to 65% of an exterior surface area of the at least one solar cell 122. In another embodiment, the first encapsulant layer 124 encapsulates 50% to 60% of an exterior surface area of the at least one solar cell 122. In another embodiment, the first encapsulant layer 124 encapsulates 55% to 60% of an exterior surface area of the at least one solar cell 122. In another embodiment, the first encapsulant layer 124 encapsulates 55% to 60% of an exterior surface area of the at least one solar cell 122.

In some embodiments, the first encapsulant layer 124 encapsulates 50% of an exterior surface area of the at least one solar cell 122. In another embodiment, the first encapsulant layer 124 encapsulates 55% of the exterior surface area of the at least one solar cell 122. In another embodiment, the first encapsulant layer 124 encapsulates 60% of the exterior surface area of the at least one solar cell 122. In another embodiment, the first encapsulant layer 124 encapsulates 65% of the exterior surface area of the at least one solar cell 122. In another embodiment, the first encapsulant layer 124 encapsulates 70% of the exterior surface area of the at least one solar cell 122. In another embodiment, the first encapsulant layer 124 encapsulates 75% of the exterior surface area of the at least one solar cell 122. In another embodiment, the first encapsulant layer 124 encapsulates 80% of the exterior surface area of the at least one solar cell 122. In another embodiment, the first encapsulant layer 124 encapsulates 85% of the exterior surface area of the at least one solar cell 122. In another embodiment, the first encapsulant layer 124 encapsulates 90% of the exterior surface area of the at least one solar cell 122. In another embodiment, the first encapsulant layer 124 encapsulates 95% of the exterior surface area of the at least one solar cell 122. In another embodiment, the first encapsulant layer 124 encapsulates 100% of the exterior surface area of the at least one solar cell 122.

In some embodiments, the second encapsulant layer 126 encapsulates 50% to 99.9% of an exterior surface area of the at least one solar cell 122. In another embodiment, the second encapsulant layer 126 encapsulates 55% to 99.9% of an exterior surface area of the at least one solar cell 122. In another embodiment, the second encapsulant layer 126 encapsulates 60% to 99.9% of an exterior surface area of the at least one solar cell 122. In another embodiment, the second encapsulant layer 126 encapsulates 65% to 99.9% of an exterior surface area of the at least one solar cell 122. In another embodiment, the second encapsulant layer 126 encapsulates 70% to 99.9% of an exterior surface area of the at least one solar cell 122. In another embodiment, the second encapsulant layer 126 encapsulates 75% to 99.9% of an exterior surface area of the at least one solar cell 122. In another embodiment, the second encapsulant layer 126 encapsulates 80% to 99.9% of an exterior surface area of the at least one solar cell 122. In another embodiment, the second encapsulant layer 126 encapsulates 85% to 99.9% of an exterior surface area of the at least one solar cell 122. In another embodiment, the second encapsulant layer 126 encapsulates 90% to 99.9% of an exterior surface area of the at least one solar cell 122. In another embodiment, the second encapsulant layer 126 encapsulates 95% to 99.9% of an exterior surface area of the at least one solar cell 122.

In another embodiment, the second encapsulant layer 126 encapsulates 50% to 95% of an exterior surface area of the at least one solar cell 122. In another embodiment, the second encapsulant layer 126 encapsulates 55% to 95% of an exterior surface area of the at least one solar cell 122. In another embodiment, the second encapsulant layer 126 encapsulates 60% to 95% of an exterior surface area of the at least one solar cell 122. In another embodiment, the second encapsulant layer 126 encapsulates 65% to 95% of an exterior surface area of the at least one solar cell 122. In another embodiment, the second encapsulant layer 126 encapsulates 70% to 95% of an exterior surface area of the at least one solar cell 122. In another embodiment, the second encapsulant layer 126 encapsulates 75% to 95% of an exterior surface area of the at least one solar cell 122. In another embodiment, the second encapsulant layer 126 encapsulates 80% to 95% of an exterior surface area of the at least one solar cell 122. In another embodiment, the second encapsulant layer 126 encapsulates 85% to 95% of an exterior surface area of the at least one solar cell 122. In another embodiment, the second encapsulant layer 126 encapsulates 90% to 95% of an exterior surface area of the at least one solar cell 122.

In another embodiment, the second encapsulant layer 126 encapsulates 50% to 90% of an exterior surface area of the at least one solar cell 122. In another embodiment, the second encapsulant layer 126 encapsulates 55% to 90% of an exterior surface area of the at least one solar cell 122. In another embodiment, the second encapsulant layer 126 encapsulates 60% to 90% of an exterior surface area of the at least one solar cell 122. In another embodiment, the second encapsulant layer 126 encapsulates 65% to 90% of an exterior surface area of the at least one solar cell 122. In another embodiment, the second encapsulant layer 126 encapsulates 70% to 90% of an exterior surface area of the at least one solar cell 122. In another embodiment, the second encapsulant layer 126 encapsulates 75% to 90% of an exterior surface area of the at least one solar cell 122. In another embodiment, the second encapsulant layer 126 encapsulates 80% to 90% of an exterior surface area of the at least one solar cell 122. In another embodiment, the second encapsulant layer 126 encapsulates 85% to 90% of an exterior surface area of the at least one solar cell 122.

In another embodiment, the second encapsulant layer 126 encapsulates 50% to 85% of an exterior surface area of the at least one solar cell 122. In another embodiment, the second encapsulant layer 126 encapsulates 55% to 85% of an exterior surface area of the at least one solar cell 122. In another embodiment, the second encapsulant layer 126 encapsulates 60% to 85% of an exterior surface area of the at least one solar cell 122. In another embodiment, the second encapsulant layer 126 encapsulates 65% to 85% of an exterior surface area of the at least one solar cell 122. In another embodiment, the second encapsulant layer 126 encapsulates 70% to 85% of an exterior surface area of the at least one solar cell 122. In another embodiment, the second encapsulant layer 126 encapsulates 75% to 85% of an exterior surface area of the at least one solar cell 122. In another embodiment, the second encapsulant layer 126 encapsulates 80% to 85% of an exterior surface area of the at least one solar cell 122.

In another embodiment, the second encapsulant layer 126 encapsulates 50% to 80% of an exterior surface area of the at least one solar cell 122. In another embodiment, the second encapsulant layer 126 encapsulates 55% to 80% of an exterior surface area of the at least one solar cell 122. In another embodiment, the second encapsulant layer 126 encapsulates 60% to 80% of an exterior surface area of the at least one solar cell 122. In another embodiment, the second encapsulant layer 126 encapsulates 65% to 80% of an exterior surface area of the at least one solar cell 122. In another embodiment, the second encapsulant layer 126 encapsulates 70% to 80% of an exterior surface area of the at least one solar cell 122. In another embodiment, the second encapsulant layer 126 encapsulates 75% to 80% of an exterior surface area of the at least one solar cell 122.

In another embodiment, the second encapsulant layer 126 encapsulates 50% to 75% of an exterior surface area of the at least one solar cell 122. In another embodiment, the second encapsulant layer 126 encapsulates 55% to 75% of an exterior surface area of the at least one solar cell 122. In another embodiment, the second encapsulant layer 126 encapsulates 60% to 75% of an exterior surface area of the at least one solar cell 122. In another embodiment, the second encapsulant layer 126 encapsulates 65% to 75% of an exterior surface area of the at least one solar cell 122. In another embodiment, the second encapsulant layer 126 encapsulates 70% to 75% of an exterior surface area of the at least one solar cell 122.

In another embodiment, the second encapsulant layer 126 encapsulates 50% to 70% of an exterior surface area of the at least one solar cell 122. In another embodiment, the second encapsulant layer 126 encapsulates 55% to 70% of an exterior surface area of the at least one solar cell 122. In another embodiment, the second encapsulant layer 126 encapsulates 60% to 70% of an exterior surface area of the at least one solar cell 122. In another embodiment, the second encapsulant layer 126 encapsulates 65% to 70% of an exterior surface area of the at least one solar cell 122.

In another embodiment, the second encapsulant layer 126 encapsulates 50% to 65% of an exterior surface area of the at least one solar cell 122. In another embodiment, the second encapsulant layer 126 encapsulates 55% to 65% of an exterior surface area of the at least one solar cell 122. In another embodiment, the second encapsulant layer 126 encapsulates 60% to 65% of an exterior surface area of the at least one solar cell 122. In another embodiment, the second encapsulant layer 126 encapsulates 50% to 60% of an exterior surface area of the at least one solar cell 122. In another embodiment, the second encapsulant layer 126 encapsulates 55% to 60% of an exterior surface area of the at least one solar cell 122. In another embodiment, the second encapsulant layer 126 encapsulates 55% to 60% of an exterior surface area of the at least one solar cell 122.

In some embodiments, the second encapsulant layer 126 encapsulates 50% of an exterior surface area of the at least one solar cell 122. In another embodiment, the second encapsulant layer 126 encapsulates 55% of the exterior surface area of the at least one solar cell 122. In another embodiment, the second encapsulant layer 126 encapsulates 60% of the exterior surface area of the at least one solar cell 122. In another embodiment, the second encapsulant layer 126 encapsulates 65% of the exterior surface area of the at least one solar cell 122. In another embodiment, the second encapsulant layer 126 encapsulates 70% of the exterior surface area of the at least one solar cell 122. In another embodiment, the second encapsulant layer 126 encapsulates 75% of the exterior surface area of the at least one solar cell 122. In another embodiment, the second encapsulant layer 126 encapsulates 80% of the exterior surface area of the at least one solar cell 122. In another embodiment, the second encapsulant layer 126 encapsulates 85% of the exterior surface area of the at least one solar cell 122. In another embodiment, the second encapsulant layer 126 encapsulates 90% of the exterior surface area of the at least one solar cell 122. In another embodiment, the second encapsulant layer 126 encapsulates 95% of the exterior surface area of the at least one solar cell 122. In another embodiment, the second encapsulant layer 126 encapsulates 100% of the exterior surface area of the at least one solar cell 122.

In some embodiments, the encapsulated solar cell 106 has a thickness of 0.5 mm to 4 mm. In another embodiment, the encapsulated solar cell 106 has a thickness of 0.5 mm to 3.5 mm. In another embodiment, the encapsulated solar cell 106 has a thickness of 0.5 mm to 3 mm. In another embodiment, the encapsulated solar cell 106 has a thickness of 0.5 mm to 2.5 mm. In another embodiment, the encapsulated solar cell 106 has a thickness of 0.5 mm to 2 mm. In another embodiment, the encapsulated solar cell 106 has a thickness of 0.5 mm to 1.5 mm. In another embodiment, the encapsulated solar cell 106 has a thickness of 0.5 mm to 1 mm.

In some embodiments, the encapsulated solar cell 106 has a thickness of 1 mm to 4 mm. In another embodiment, the encapsulated solar cell 106 has a thickness of 1 mm to 3.5 mm. In another embodiment, the encapsulated solar cell 106 has a thickness of 1 mm to 3 mm. In another embodiment, the encapsulated solar cell 106 has a thickness of 1 mm to 2.5 mm. In another embodiment, the encapsulated solar cell 106 has a thickness of 1 mm to 2 mm. In another embodiment, the encapsulated solar cell 106 has a thickness of 1 mm to 1.5 mm. In some embodiments, the encapsulated solar cell 106 has a thickness of 1.5 mm to 4 mm. In another embodiment, the encapsulated solar cell 106 has a thickness of 1.5 mm to 3.5 mm. In another embodiment, the encapsulated solar cell 106 has a thickness of 1.5 mm to 3 mm. In another embodiment, the encapsulated solar cell 106 has a thickness of 1.5 mm to 2.5 mm. In another embodiment, the encapsulated solar cell 106 has a thickness of 1.5 mm to 2 mm.

In some embodiments, the encapsulated solar cell 106 has a thickness of 2 mm to 4 mm. In another embodiment, the encapsulated solar cell 106 has a thickness of 2 mm to 3.5 mm. In another embodiment, the encapsulated solar cell 106 has a thickness of 2 mm to 3 mm. In another embodiment, the encapsulated solar cell 106 has a thickness of 2 mm to 2.5 mm. In some embodiments, the encapsulated solar cell 106 has a thickness of 2.5 mm to 4 mm. In another embodiment, the encapsulated solar cell 106 has a thickness of 2.5 mm to 3.5 mm. In another embodiment, the encapsulated solar cell 106 has a thickness of 2.5 mm to 3 mm. In some embodiments, the encapsulated solar cell 106 has a thickness of 3 mm to 4 mm. In another embodiment, the encapsulated solar cell 106 has a thickness of 3 mm to 3.5 mm. In some embodiments, the encapsulated solar cell 106 has a thickness of 3.5 mm to 4 mm.

In some embodiments, the encapsulated solar cell 106 has a thickness of 0.5 mm. In some embodiments, the encapsulated solar cell 106 has a thickness of 0.6 mm. In some embodiments, the encapsulated solar cell 106 has a thickness of 0.7 mm. In some embodiments, the encapsulated solar cell 106 has a thickness of 0.8 mm. In some embodiments, the encapsulated solar cell 106 has a thickness of 0.9 mm. In some embodiments, the encapsulated solar cell 106 has a thickness of 1 mm. In some embodiments, the encapsulated solar cell 106 has a thickness of 1.5 mm. In some embodiments, the encapsulated solar cell 106 has a thickness of 2 mm. In some embodiments, the encapsulated solar cell 106 has a thickness of 2.5 mm. In some embodiments, the encapsulated solar cell 106 has a thickness of 3 mm. In some embodiments, the encapsulated solar cell 106 has a thickness of 3.5 mm. In some embodiments, the encapsulated solar cell 106 has a thickness of 4 mm.

In some embodiments, a first encapsulant layer 124 has a thickness of 0.2 mm to 2 mm. In some embodiments, the first encapsulant layer 124 has a thickness of 0.2 mm to 1.5 mm. In some embodiments, the first encapsulant layer 124 has a thickness of 0.2 mm to 1 mm. In some embodiments, the first encapsulant layer 124 has a thickness of 0.2 mm to 0.6 mm. In some embodiments, the first encapsulant layer 124 has a thickness of 0.2 mm to 0.5 mm. In some embodiments, the first encapsulant layer 124 has a thickness of 0.5 mm to 2 mm. In some embodiments, the first encapsulant layer 124 has a thickness of 0.5 mm to 1.5 mm. In some embodiments, the first encapsulant layer 124 has a thickness of 0.5 mm to 1 mm. In some embodiments, the first encapsulant layer 124 has a thickness of 1 mm to 2 mm. In some embodiments, the first encapsulant layer 124 has a thickness of 1 mm to 1.5 mm. In some embodiments, the first encapsulant layer 124 has a thickness of 1.5 mm to 2 mm.

In some embodiments, the first encapsulant layer 124 has a thickness of 0.2 mm. In some embodiments, the first encapsulant layer 124 has a thickness of 0.3 mm. In some embodiments, the first encapsulant layer 124 has a thickness of 0.4 mm. In some embodiments, the first encapsulant layer 124 has a thickness of 0.45 mm. In some embodiments, the first encapsulant layer 124 has a thickness of 0.5 mm. In some embodiments, the first encapsulant layer 124 has a thickness of 0.6 mm. In some embodiments, the first encapsulant layer 124 has a thickness of 1 mm. In some embodiments, the first encapsulant layer 124 has a thickness of 1.5 mm. In some embodiments, the first encapsulant layer 124 has a thickness of 2 mm. In some embodiments, the first encapsulant layer 124 has a thickness of 2.5 mm. In some embodiments, the first encapsulant layer 124 has a thickness of 3 mm. In some embodiments, the first encapsulant layer 124 has a thickness of 3.5 mm. In some embodiments, the first encapsulant layer 124 has a thickness of 4 mm.

In some embodiments, the second encapsulant layer 126 has a thickness of 0.2 mm to 2 mm. In some embodiments, the second encapsulant layer 126 has a thickness of 0.2 mm to 1.5 mm. In some embodiments, the second encapsulant layer 126 has a thickness of 0.2 mm to 1 mm. In some embodiments, the second encapsulant layer 126 has a thickness of 0.2 mm to 0.5 mm. In some embodiments, the second encapsulant layer 126 has a thickness of 0.5 mm to 2 mm. In some embodiments, the second encapsulant layer 126 has a thickness of 0.5 mm to 1.5 mm. In some embodiments, the second encapsulant layer 126 has a thickness of 0.5 mm to 1 mm. In some embodiments, the second encapsulant layer 126 has a thickness of 1 mm to 2 mm. In some embodiments, the second encapsulant layer 126 has a thickness of 1 mm to 1.5 mm. In some embodiments, the second encapsulant layer 126 has a thickness of 1.5 mm to 2 mm.

In some embodiments, the second encapsulant layer 126 has a thickness of 0.2 mm. In some embodiments, the second encapsulant layer 126 has a thickness of 0.3 mm. In some embodiments, the second encapsulant layer 126 has a thickness of 0.4 mm. In some embodiments, the second encapsulant layer 126 has a thickness of 0.45 mm. In some embodiments, the second encapsulant layer 126 has a thickness of 0.5 mm. In some embodiments, the second encapsulant layer 126 has a thickness of 1 mm. In some embodiments, the second encapsulant layer 126 has a thickness of 1.5 mm. In some embodiments, the second encapsulant layer 126 has a thickness of 2 mm. In some embodiments, the second encapsulant layer 126 has a thickness of 2.5 mm. In some embodiments, the second encapsulant layer 126 has a thickness of 3 mm. In some embodiments, the second encapsulant layer 126 has a thickness of 3.5 mm. In some embodiments, the second encapsulant layer 126 has a thickness of 4 mm.

In some embodiments, the thickness of the first encapsulant layer 124 is equal to the thickness of the second encapsulant layer 126. In another embodiment, the thickness of the first encapsulant layer 124 is different from the thickness of the second encapsulant layer 126.

In some embodiments, the first encapsulant layer 124 comprises at least one of polyolefins, ethyl vinyl acetates, ionomers, silicones, poly vinyl butyral, epoxies, polyurethanes, any hybrids thereof, or any combinations thereof. In some embodiments, the first encapsulant layer 124 is made from thermosetting polyolefin. In some embodiments, the second encapsulant layer 126 comprises at least one of polyolefins, ethyl vinyl acetates, ionomers, silicones, poly vinyl butyral, epoxies, polyurethanes, any hybrids thereof, or any combinations thereof. In some embodiments, the second encapsulant layer 126 is made from thermosetting polyolefin.

In some embodiments, the photovoltaic shingle 100 has a first end, a second end opposite the first end, a first surface extending from the first end to the second end, and a second surface opposite the first surface and extending from the first end to the second end. In some embodiments, the first surface is an upper, sun facing-side surface of the photovoltaic shingle 100, and the second surface is a lower surface configured to face a roof deck on which the photovoltaic shingle 100 is installed on the roof deck. In some embodiments, the photovoltaic shingle is installed on a roof deck. In some embodiments, the photovoltaic shingle is directly installed on a roof deck. In some embodiments, the photovoltaic shingle is fastened to a roof deck by at least one mechanical fastener. In some embodiments, the photovoltaic shingle is adhered to a roof deck by an adhesive layer. In some embodiments, the photovoltaic shingle directly contacts a roofing deck. In some embodiments, an intervening layer is located between the photovoltaic shingle and the roof deck. In some embodiments, the backsheet 104 of the photovoltaic shingle directly contacts the roof deck.

In some embodiments, the at least one solar cell 122 includes a plurality of the solar cells. In some embodiments, the plurality of solar cells includes two solar cells. In some embodiments, the plurality of solar cells includes three solar cells. In some embodiments, the plurality of solar cells includes four solar cells. In some embodiments, the plurality of solar cells includes five solar cells. In some embodiments, the plurality of solar cells includes six solar cells. In some embodiments, the plurality of solar cells includes seven solar cells. In some embodiments, the plurality of solar cells includes eight solar cells. In some embodiments, the plurality of solar cells includes nine solar cells. In some embodiments, the plurality of solar cells includes ten solar cells. In some embodiments, the plurality of solar cells includes eleven solar cells. In some embodiments, the plurality of solar cells includes twelve solar cells. In some embodiments, the plurality of solar cells includes thirteen solar cells. In some embodiments, the plurality of solar cells includes fourteen solar cells. In some embodiments, the plurality of solar cells includes fifteen solar cells. In some embodiments, the plurality of solar cells includes sixteen solar cells. In some embodiments, the plurality of solar cells includes more than sixteen solar cells.

In some embodiments, the plurality of solar cells is arranged in one row (i.e., one reveal). In another embodiment, the plurality of solar cells is arranged in two rows (i.e., two reveals). In another embodiment, the plurality of solar cells is arranged in three rows (i.e., three reveals). In another embodiment, the plurality of solar cells is arranged in four rows (i.e., four reveals). In another embodiment, the plurality of solar cells is arranged in five rows (i.e., five reveals). In another embodiment, the plurality of solar 138 is arranged in six rows (i.e., six reveals). In other embodiments, the plurality of solar cells is arranged in more than six rows.

In some embodiments, the photovoltaic shingle reflects at least 1% less of incident light, relative to a photovoltaic shingle without the anti-reflective coating. In some embodiments, the photovoltaic shingle reflects at least 2% less of incident light, relative to a photovoltaic shingle without the anti-reflective coating. In some embodiments, the photovoltaic shingle reflects at least 3% less of incident light, relative to a photovoltaic shingle without the anti-reflective coating. In some embodiments, the photovoltaic shingle reflects at least 4% less of incident light, relative to a photovoltaic shingle without the anti-reflective coating. In some embodiments, the photovoltaic shingle reflects at least 5% less of incident light, relative to a photovoltaic shingle without the anti-reflective coating. In some embodiments, the photovoltaic shingle reflects at least 6% less of incident light, relative to a photovoltaic shingle without the anti-reflective coating. In some embodiments, the photovoltaic shingle reflects at least 7% less of incident light, relative to a photovoltaic shingle without the anti-reflective coating. In some embodiments, the photovoltaic shingle reflects at least 8% less of incident light, relative to a photovoltaic shingle without the anti-reflective coating. In some embodiments, the photovoltaic shingle reflects at least 9% less of incident light, relative to a photovoltaic shingle without the anti-reflective coating. In some embodiments, the photovoltaic shingle reflects at least 10% less of incident light, relative to a photovoltaic shingle without the anti-reflective coating.

In some embodiments, the photovoltaic shingle reflects at least 20% less of incident light, relative to a photovoltaic shingle without the anti-reflective coating. In some embodiments, the photovoltaic shingle reflects at least 30% less of incident light, relative to a photovoltaic shingle without the anti-reflective coating. In some embodiments, the photovoltaic shingle reflects at least 40% less of incident light, relative to a photovoltaic shingle without the anti-reflective coating. In some embodiments, the photovoltaic shingle reflects at least 50% less of incident light, relative to a photovoltaic shingle without the anti-reflective coating. In some embodiments, the photovoltaic shingle reflects at least 60% less of incident light, relative to a photovoltaic shingle without the anti-reflective coating. In some embodiments, the photovoltaic shingle reflects at least 70% less of incident light, relative to a photovoltaic shingle without the anti-reflective coating. In some embodiments, the photovoltaic shingle reflects at least 80% less of incident light, relative to a photovoltaic shingle without the anti-reflective coating. In some embodiments, the photovoltaic shingle reflects at least 90% less of incident light, relative to a photovoltaic shingle without the anti-reflective coating.

In some embodiments, the photovoltaic shingle reflects 1% to 99% less of incident light, relative to a photovoltaic shingle without the anti-reflective coating. In some embodiments, the photovoltaic shingle reflects 1% to 90% less of incident light, relative to a photovoltaic shingle without the anti-reflective coating. In some embodiments, the photovoltaic shingle reflects 1% to 80% less of incident light, relative to a photovoltaic shingle without the anti-reflective coating. In some embodiments, the photovoltaic shingle reflects 1% to 70% less of incident light, relative to a photovoltaic shingle without the anti-reflective coating. In some embodiments, the photovoltaic shingle reflects 1% to 60% less of incident light, relative to a photovoltaic shingle without the anti-reflective coating. In some embodiments, the photovoltaic shingle reflects 1% to 50% less of incident light, relative to a photovoltaic shingle without the anti-reflective coating. In some embodiments, the photovoltaic shingle reflects 1% to 40% less of incident light, relative to a photovoltaic shingle without the anti-reflective coating. In some embodiments, the photovoltaic shingle reflects 1% to 30% less of incident light, relative to a photovoltaic shingle without the anti-reflective coating. In some embodiments, the photovoltaic shingle reflects 1% to 20% less of incident light, relative to a photovoltaic shingle without the anti-reflective coating. In some embodiments, the photovoltaic shingle reflects 1% to 10% less of incident light, relative to a photovoltaic shingle without the anti-reflective coating.

In some embodiments, the photovoltaic shingle reflects 1% to 9% less of incident light, relative to a photovoltaic shingle without the anti-reflective coating. In some embodiments, the photovoltaic shingle reflects 1% to 8% less of incident light, relative to a photovoltaic shingle without the anti-reflective coating. In some embodiments, the photovoltaic shingle reflects 1% to 7% less of incident light, relative to a photovoltaic shingle without the anti-reflective coating. In some embodiments, the photovoltaic shingle reflects 1% to 6% less of incident light, relative to a photovoltaic shingle without the anti-reflective coating. In some embodiments, the photovoltaic shingle reflects 1% to 5% less of incident light, relative to a photovoltaic shingle without the anti-reflective coating. In some embodiments, the photovoltaic shingle reflects 1% to 4% less of incident light, relative to a photovoltaic shingle without the anti-reflective coating. In some embodiments, the photovoltaic shingle reflects 1% to 3% less of incident light, relative to a photovoltaic shingle without the anti-reflective coating. In some embodiments, the photovoltaic shingle reflects 1% to 2% less of incident light, relative to a photovoltaic shingle without the anti-reflective coating. In some embodiments, the photovoltaic shingle reflects 0.1% to 1% less of incident light, relative to a photovoltaic shingle without the anti-reflective coating.

In some embodiments, the photovoltaic shingle reflects 10% to 99% less of incident light, relative to a photovoltaic shingle without the anti-reflective coating. In some embodiments, the photovoltaic shingle reflects 20% to 99% less of incident light, relative to a photovoltaic shingle without the anti-reflective coating. In some embodiments, the photovoltaic shingle reflects 30% to 99% less of incident light, relative to a photovoltaic shingle without the anti-reflective coating. In some embodiments, the photovoltaic shingle reflects 40% to 99% less of incident light, relative to a photovoltaic shingle without the anti-reflective coating. In some embodiments, the photovoltaic shingle reflects 50% to 99% less of incident light, relative to a photovoltaic shingle without the anti-reflective coating. In some embodiments, the photovoltaic shingle reflects 60% to 99% less of incident light, relative to a photovoltaic shingle without the anti-reflective coating. In some embodiments, the photovoltaic shingle reflects 70% to 99% less of incident light, relative to a photovoltaic shingle without the anti-reflective coating. In some embodiments, the photovoltaic shingle reflects 80% to 99% less of incident light, relative to a photovoltaic shingle without the anti-reflective coating. In some embodiments, the photovoltaic shingle reflects 90% to 99% less of incident light, relative to a photovoltaic shingle without the anti-reflective coating.

Figure 2:
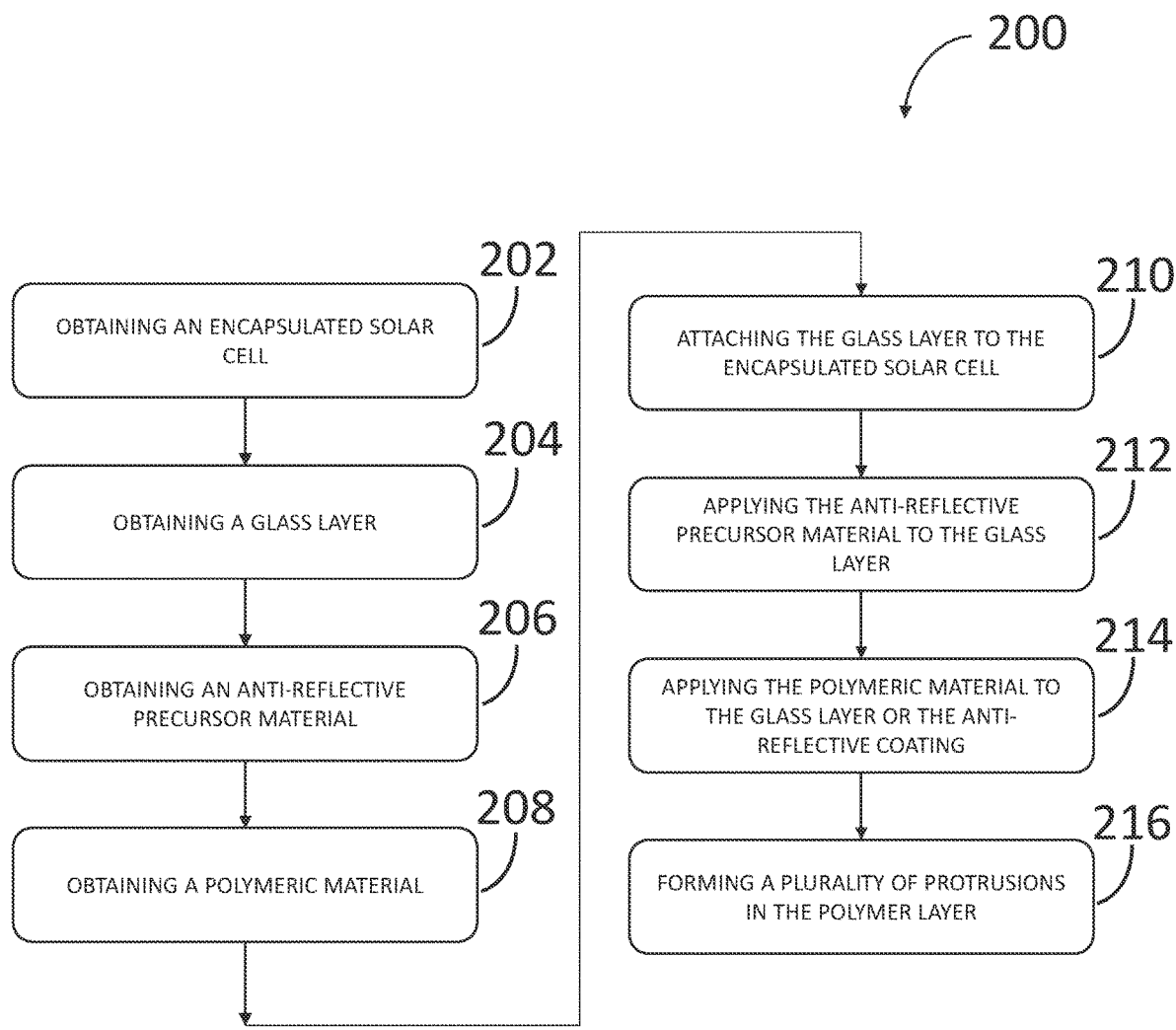
FIG. 2 is a flowchart of a method of manufacturing a photovoltaic shingle, according to some embodiments.

FIG. 2 is a flowchart of a method of manufacturing 200, according to some embodiments. As shown in FIG. 2, in some embodiments, the method of manufacturing 200 may comprise one or more of the following steps: a step 202 of obtaining encapsulated solar cell; a step 204 of obtaining a glass layer; a step 206 of obtaining an anti-reflective precursor material; a step 208 of obtaining a polymeric material; a step 210 of attaching the glass layer to the encapsulated solar cell; a step 212 of applying the anti-reflective precursor material to the glass layer, so as to form an anti-reflective coating; a step 214 of applying the polymeric material to the glass layer or the anti-reflective coating, so as to form a polymer layer; and a step 216 of forming a plurality of protrusions in the polymer layer, so as to form a photovoltaic shingle. In some embodiments, the photovoltaic shingle is formed by at least one of laminating, extruding, co-extruding, or any combination thereof.

In some embodiments, the photovoltaic shingle has a first end, a second end opposite the first end, a first edge extending from the first end to the second end, and a second edge opposite the first edge and extending from the first end to the second end. In some embodiments, the glass layer has a first end, a second end opposite the first end, a first edge extending from the first end to the second end, and a second edge opposite the first edge and extending from the first end to the second end. In some embodiments, the anti-reflective coating has a first end, a second end opposite the first end, a first edge extending from the first end to the second end, and a second edge opposite the first edge and extending from the first end to the second end.

In some embodiments, the polymeric material is applied to a portion of a surface of the glass layer or the anti-reflective coating. In some embodiments, the polymeric material is applied in a plurality of strips from the first end of the photovoltaic shingle to the second end of the photovoltaic shingle. In some embodiments, the polymeric material is applied to an entire surface of the glass layer or the anti-reflective coating. In some embodiments, the plurality of protrusions is formed by removing a portion of the polymeric material, the polymer layer, or any combination thereof. In some embodiments, the plurality of protrusions is formed by etching a portion of the polymeric material, the polymer layer, or any combination thereof. In some embodiments, the plurality of protrusions is formed by scraping a portion of the polymeric material, the polymer layer, or any combination thereof. In some embodiments, the plurality of protrusions is formed by ablating (e.g., laser ablation) a portion of the polymeric material, the polymer layer, or any combination thereof.

What is claimed is:

1. A roofing system comprising:
a roof deck; and
a plurality of photovoltaic shingles installed on the roof deck, each of the plurality of photovoltaic shingles comprising:
a plurality of protrusions;
an adhesive layer;
an anti-reflective coating,
wherein the anti-reflective coating has an upper surface;
a glass layer; and
an encapsulated solar cell;
wherein the anti-reflective coating is located between the plurality of protrusions and the glass layer;
wherein the adhesive layer is located between the plurality of protrusions and the anti-reflective coating;
wherein the glass layer is located between the anti-reflective coating and the encapsulated solar cell;
wherein the encapsulated solar cell is located between the glass layer and the roof deck;
wherein the adhesive layer does not cover at least a portion of the upper surface of the anti-reflective coating;
wherein the at least a portion of the upper surface of the anti-reflective coating is exposed between the plurality of protrusions.

2. The roofing system of claim 1, wherein the plurality of protrusions covers 1% to 99% of the anti-reflective coating.

3. The roofing system of claim 1, wherein the anti-reflective coating covers an entire surface of the glass layer.

4. The roofing system of claim 1, wherein 1% to 99% of the anti-reflective coating is exposed between the plurality of protrusions.

5. The roofing system of claim 1, wherein the anti-reflective coating is adhered to the glass layer by an adhesive layer.

6. The roofing system of claim 1, wherein the glass layer directly contacts the encapsulated solar cell.

7. The roofing system of claim 1, wherein the anti-reflective coating comprises at least one a metal oxide, a metal nitride, a metal fluoride, a polymer, or any combination thereof.

8. The roofing system of claim 1, wherein the plurality of protrusions comprises at least one of ethylene tetrafluoroethylene (ETFE), polyvinylidene fluoride (PVDF), tetrafluoroethylene-hexafluoropropylene copolymers (FEP), tetrafluoroethylene-hexafluoropropylene-vinylidene fluoride copolymers (THV), polyvinyl fluoride (PVF), polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), polyimide, or any combination thereof.

9. The roofing system of claim 1, wherein each of the plurality of photovoltaic shingles reflects at least 1% less of incident light, relative to a photovoltaic shingle without the anti-reflective coating.

10. A photovoltaic shingle comprising:
a plurality of protrusions;
an adhesive layer;
an anti-reflective coating,
wherein the anti-reflective coating has an upper surface;
a glass layer; and
an encapsulated solar cell;
wherein the anti-reflective coating is located between the plurality of protrusions and the glass layer;
wherein the adhesive layer is located between the plurality of protrusions and the anti-reflective coating;
wherein the glass layer is located between the anti-reflective coating and the encapsulated solar cell;
wherein the adhesive layer does not cover at least a portion of the upper surface of the anti-reflective coating;

wherein the at least a portion of the upper surface of the anti-reflective coating is exposed between the plurality of protrusions.

11. The photovoltaic shingle of claim 10, wherein the plurality of protrusions covers 1% to 99% of the anti-reflective coating.

12. The photovoltaic shingle of claim 10, wherein the anti-reflective coating covers an entire surface of the glass layer.

13. The photovoltaic shingle of claim 10, wherein 1% to 99% of the anti-reflective coating is exposed between the plurality of protrusions.

14. The photovoltaic shingle of claim 10, wherein the anti-reflective coating is adhered to the glass layer by an adhesive layer.

15. The photovoltaic shingle of claim 10, wherein the glass layer directly contacts the encapsulated solar cell.

16. The photovoltaic shingle of claim 10, wherein the photovoltaic shingle reflects at least 1% less of incident light, relative to a photovoltaic shingle without the anti-reflective coating.

17. A roofing system comprising:
    a roof deck; and
    a plurality of photovoltaic shingles installed on the roof deck, each of the plurality of photovoltaic shingles comprising:
        a plurality of protrusions;
        an adhesive layer;
        an anti-reflective coating,
            wherein the anti-reflective coating has an upper surface;
        a glass layer; and
        an encapsulated solar cell;
            wherein the anti-reflective coating is located between the plurality of protrusions and the glass layer;
            wherein the adhesive layer is located between the plurality of protrusions and the anti-reflective coating;
            wherein the glass layer is located between the anti-reflective coating and the encapsulated solar cell;
            wherein the adhesive layer does not cover at least a portion of the upper surface of the anti-reflective coating;
            wherein the at least a portion of the upper surface of the anti-reflective coating is exposed between the plurality of protrusions.

18. The roofing system of claim 17, wherein the plurality of protrusions covers 1% to 99% of the anti-reflective coating.

19. The roofing system of claim 17, wherein the anti-reflective coating covers an entire surface of the glass layer.

20. The roofing system of claim 17, wherein 1% to 99% of the anti-reflective coating is exposed between the plurality of protrusions.

* * * * *